(12) United States Patent
Frougier et al.

(10) Patent No.: US 12,046,643 B2
(45) Date of Patent: Jul. 23, 2024

(54) SEMICONDUCTOR STRUCTURES WITH POWER RAIL DISPOSED UNDER ACTIVE GATE

(71) Applicant: International Business Machines Corporation, Armonk, NY (US)

(72) Inventors: Julien Frougier, Albany, NY (US); Ruilong Xie, Niskayuna, NY (US); Kangguo Cheng, Schenectady, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 438 days.

(21) Appl. No.: 17/479,966

(22) Filed: Sep. 20, 2021

(65) Prior Publication Data

US 2023/0087690 A1 Mar. 23, 2023

(51) Int. Cl.
*H01L 29/417* (2006.01)
*H01L 23/535* (2006.01)
(Continued)

(52) U.S. Cl.
CPC ...... *H01L 29/41733* (2013.01); *H01L 23/535* (2013.01); *H01L 27/1203* (2013.01);
(Continued)

(58) Field of Classification Search
CPC ............. H01L 29/41733; H01L 23/535; H01L 27/1203; H01L 29/401; H01L 29/66742;
(Continued)

(56) References Cited

U.S. PATENT DOCUMENTS 9,570,395 B1 2/2017 Sengupta et al.
10,586,765 B2 3/2020 Smith et al.
(Continued)

FOREIGN PATENT DOCUMENTS

| CN | 110998858 A | 4/2020 |
|---|---|---|
| TW | 202020978 A | 6/2020 |
| TW | 202105720 A | 2/2021 |

OTHER PUBLICATIONS

Specification of U.S. Appl. No. 63/075,994 (Year: 2020).*
(Continued)

*Primary Examiner* — J. E. Schoenholtz
(74) *Attorney, Agent, or Firm* — Samuel Waldbaum; Ryan, Mason & Lewis, LLP

(57) ABSTRACT

Semiconductor structures are disclosed which comprise semiconductor devices having buried power rails. In one example, a semiconductor structure comprises a plurality of semiconductor devices. Each of the semiconductor devices is isolated from an adjacent semiconductor device by a dielectric layer. The semiconductor structure further comprises a first diffusion break extending across the plurality of semiconductor devices, a second diffusion break extending across the plurality of semiconductor devices and a plurality of gates extending across the plurality of semiconductor devices. The gates are disposed between the first diffusion break and the second diffusion break. Each semiconductor device comprises a power rail extending between the first diffusion break and the second diffusion break under the plurality of gates.

25 Claims, 36 Drawing Sheets

(51) Int. Cl.
  *H01L 27/12* (2006.01)
  *H01L 29/40* (2006.01)
  *H01L 29/423* (2006.01)
  *H01L 29/66* (2006.01)

(52) U.S. Cl.
  CPC ...... *H01L 29/401* (2013.01); *H01L 29/66742* (2013.01); *H01L 29/42392* (2013.01)

(58) Field of Classification Search
  CPC ....... H01L 29/42392; H01L 21/823475; H01L 27/088; H01L 29/78696; H01L 21/76883; H01L 21/743; H01L 21/76897; H01L 23/5286
  See application file for complete search history.

(56) References Cited

U.S. PATENT DOCUMENTS

| | | | |
|---|---|---|---|
| 10,636,739 | B2 | 4/2020 | Beyne et al. |
| 10,734,224 | B2 | 8/2020 | Smith et al. |
| 10,957,575 | B2 | 3/2021 | Yakimets et al. |
| 2012/0280287 | A1 | 11/2012 | Hou et al. |
| 2018/0145030 | A1 | 5/2018 | Beyne et al. |
| 2018/0374791 | A1 | 12/2018 | Smith et al. |
| 2019/0057867 | A1* | 2/2019 | Smith ............... H01L 29/66545 |
| 2019/0080969 | A1 | 3/2019 | Tsao |
| 2020/0075574 | A1 | 3/2020 | Smith et al. |
| 2020/0135578 | A1 | 4/2020 | Ching et al. |
| 2020/0373330 | A1 | 11/2020 | Liebmann et al. |
| 2021/0035860 | A1 | 2/2021 | Dentoni Litta et al. |
| 2021/0098294 | A1 | 4/2021 | Smith et al. |
| 2021/0280474 | A1 | 9/2021 | Wang et al. |
| 2022/0077062 | A1* | 3/2022 | Van Dal ............... H01L 29/0673 |
| 2022/0302111 | A1 | 9/2022 | Wu et al. |

OTHER PUBLICATIONS

A. Gupta et al., "Buried Power Rail Integration with Si FinFETs for CMOS Scaling beyond the 5 nm Node," 2020 IEEE Symposium on VLSI Technology, Honolulu, HI, USA, 2020, pp. 1-2, doi: 10.1109/VLSITechnology18217.2020.9265113. (Year: 2020).*

A. Gupta et al., "Buried Power Rail Integration With FinFETs for Ultimate CMOS Scaling." IEEE Transactions on Electron Devices, vol. 67, No. 12, Dec. 2020, pp. 5349-5354.

Anonymous, "Method and Structure for Implementing Replacement/ Buried Power Rail in VTFET," https://ip.com/IPCOM/000260354, Nov. 14, 2019, 6 pages.

International Search Report and Written Opinion of PCT/IB2022/055925, Oct. 11, 2022, 7 pages.

* cited by examiner

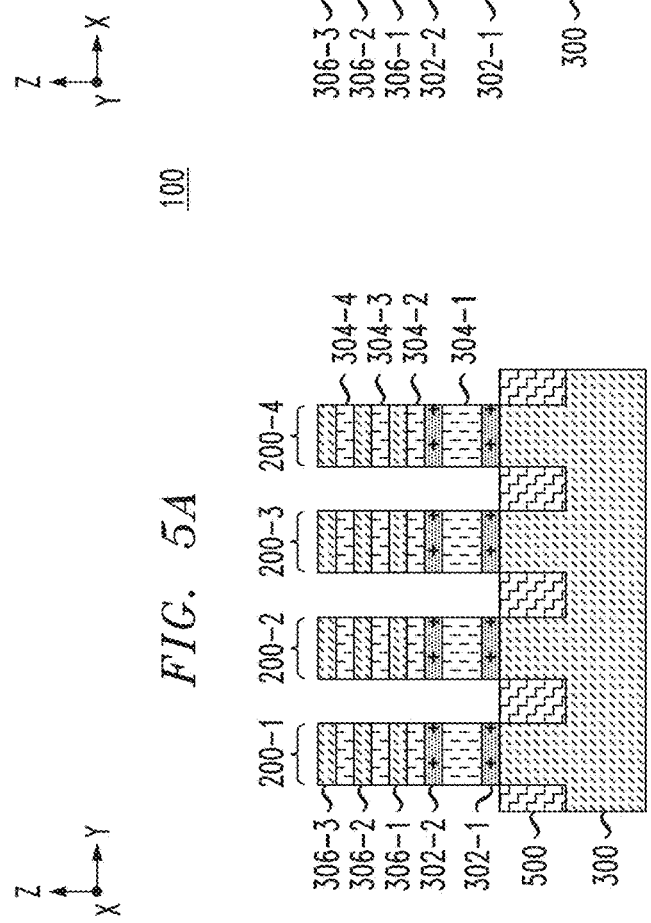

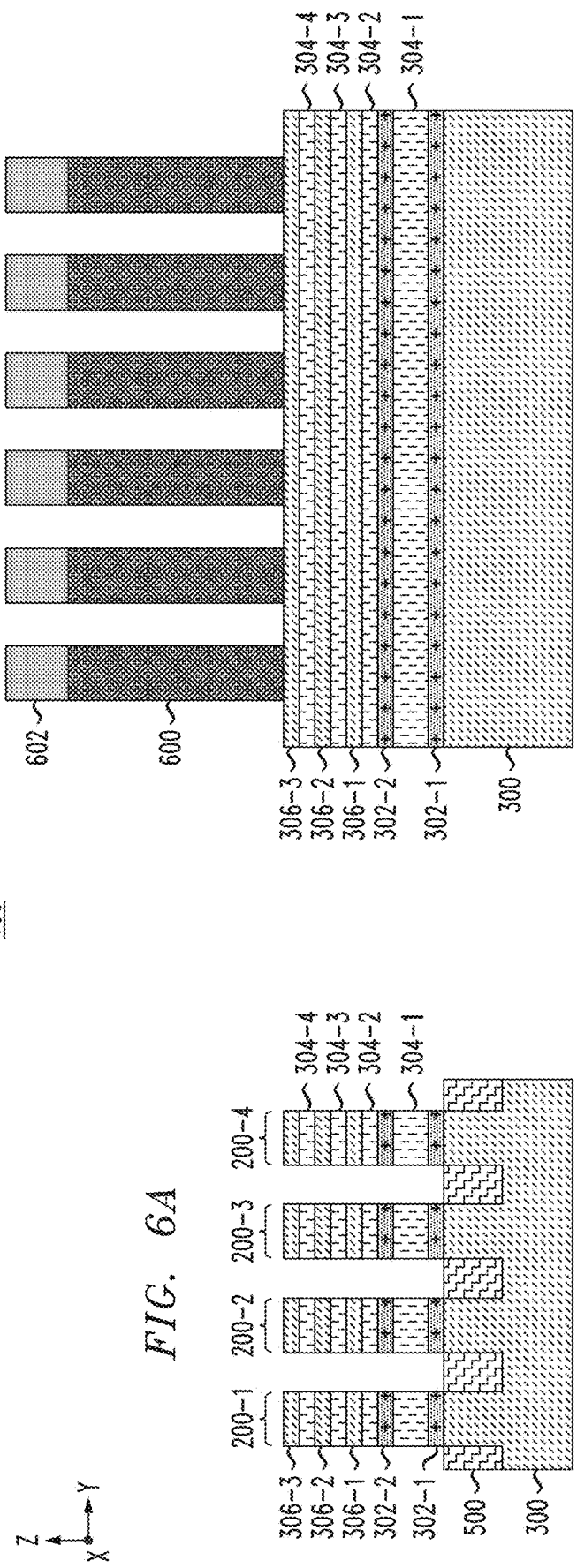

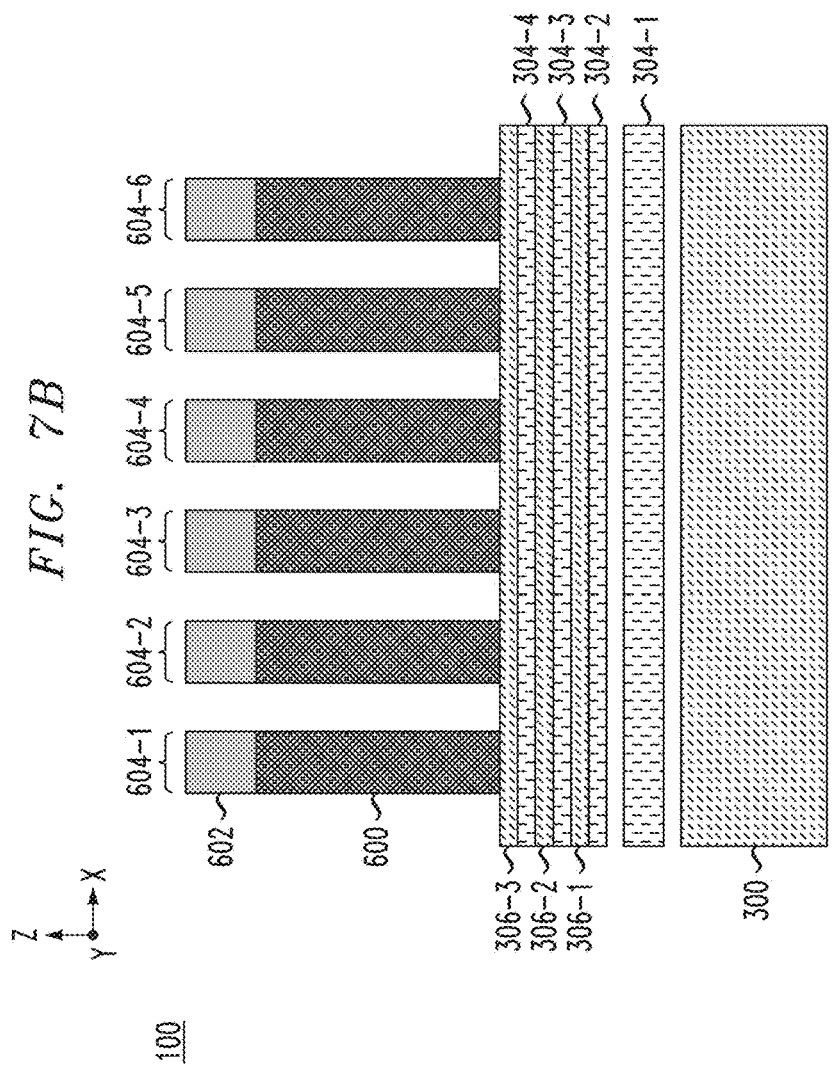
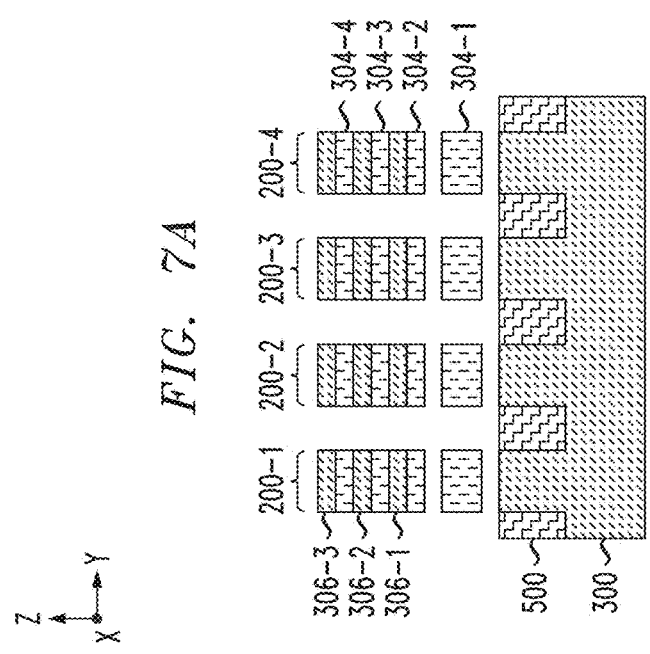

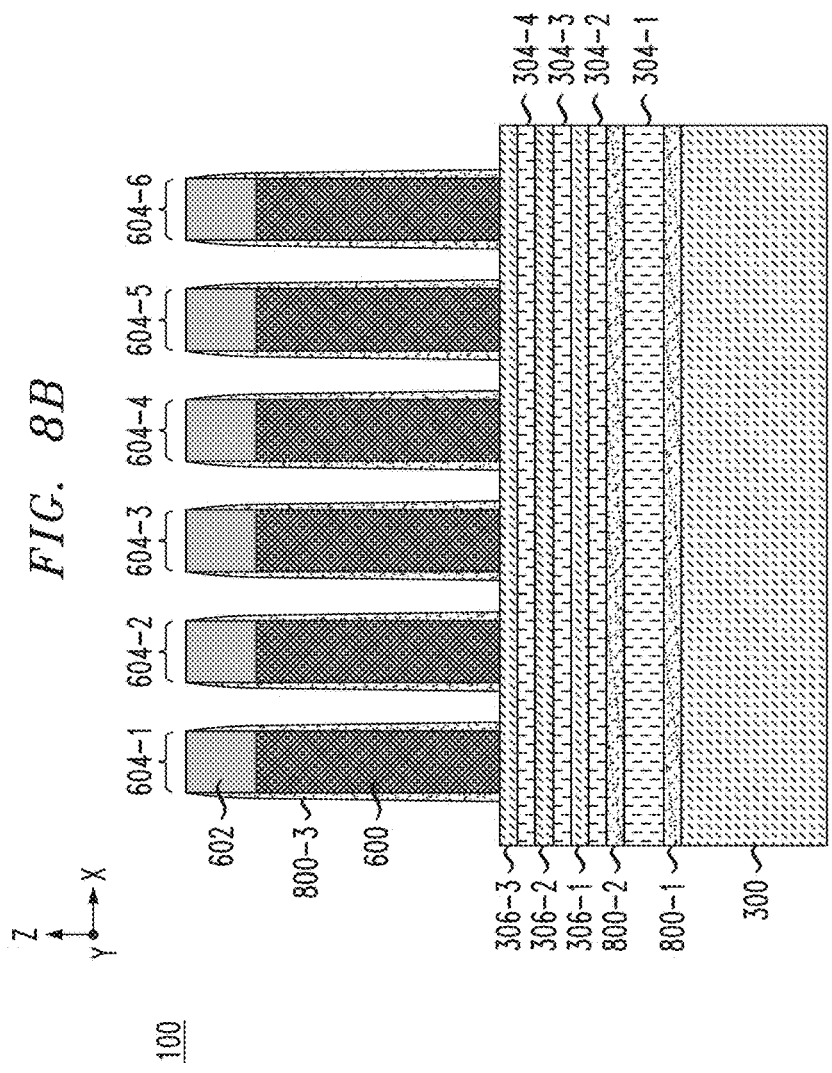
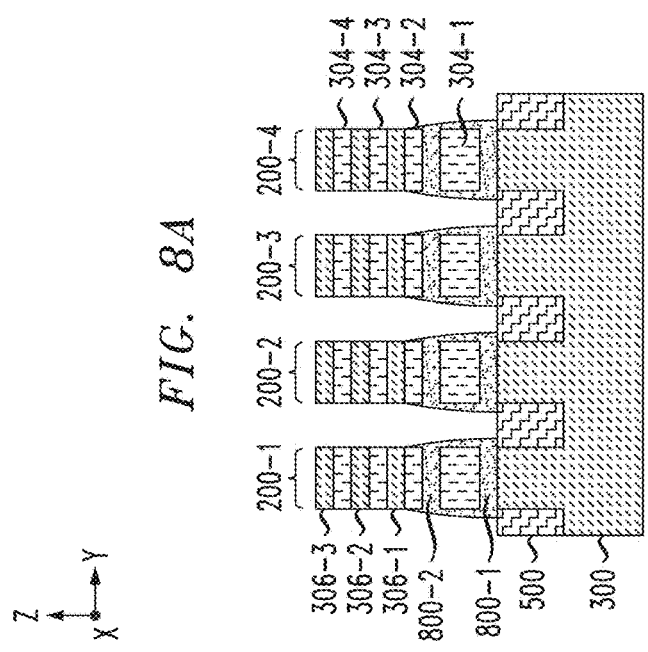

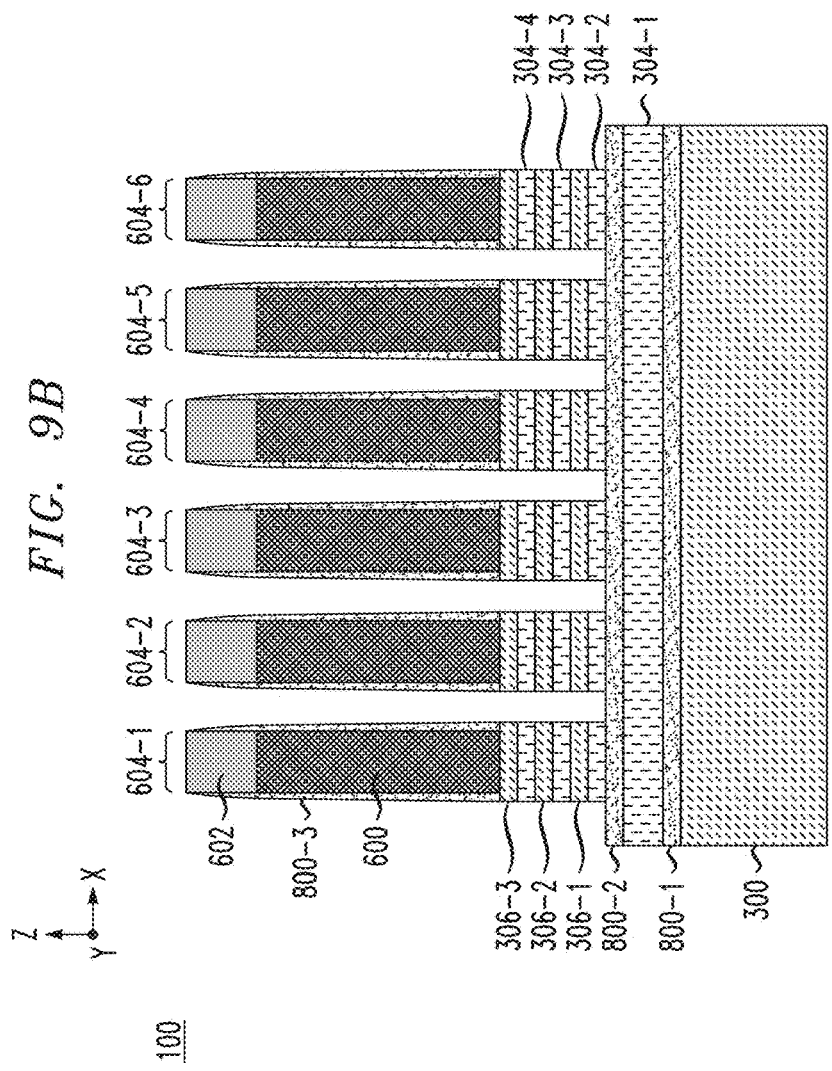
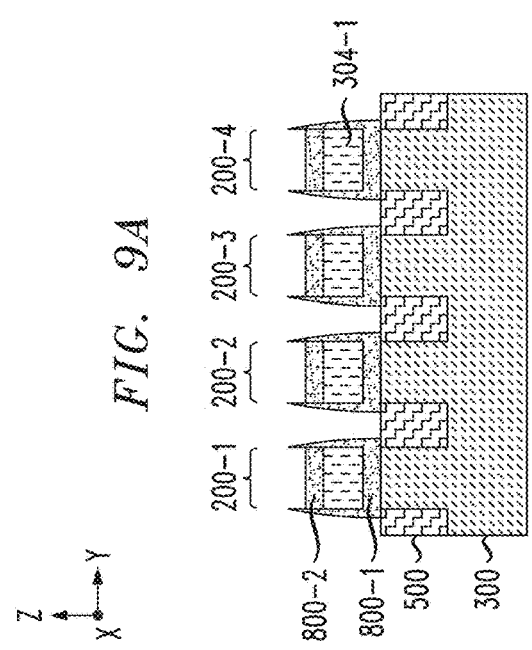

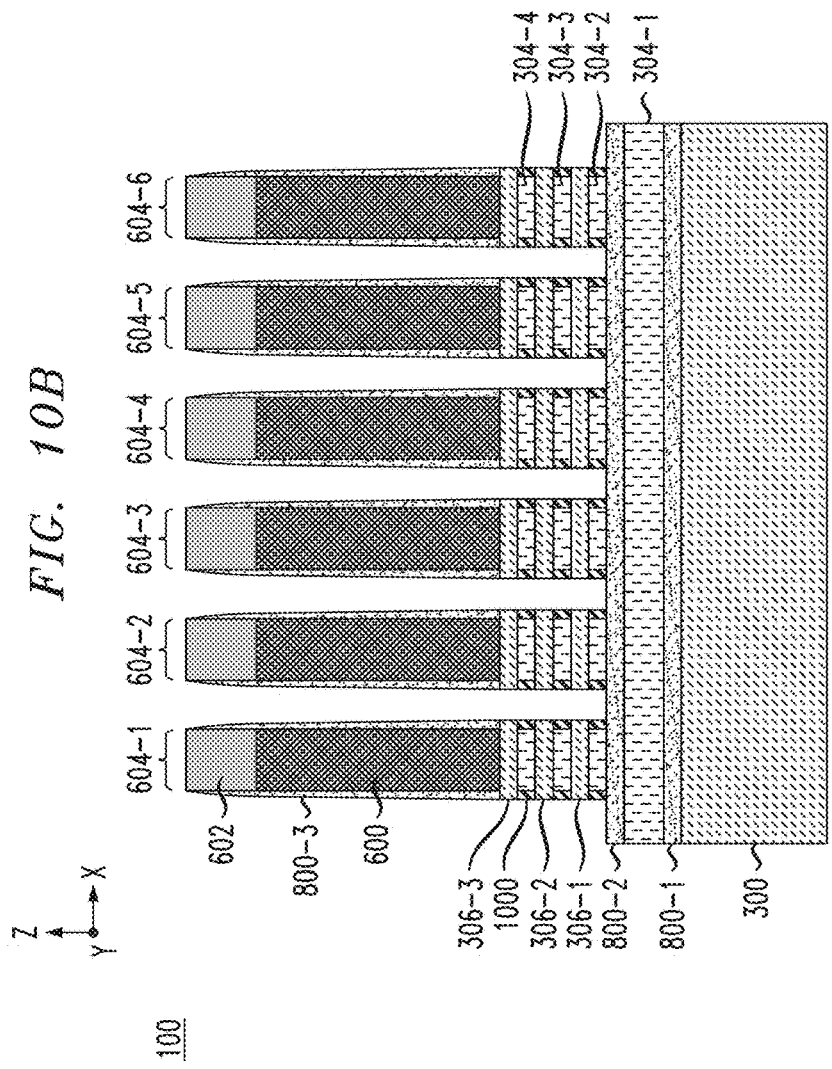
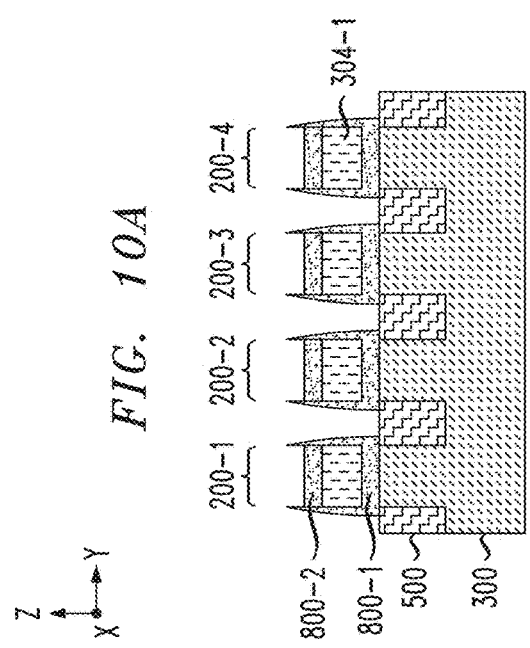

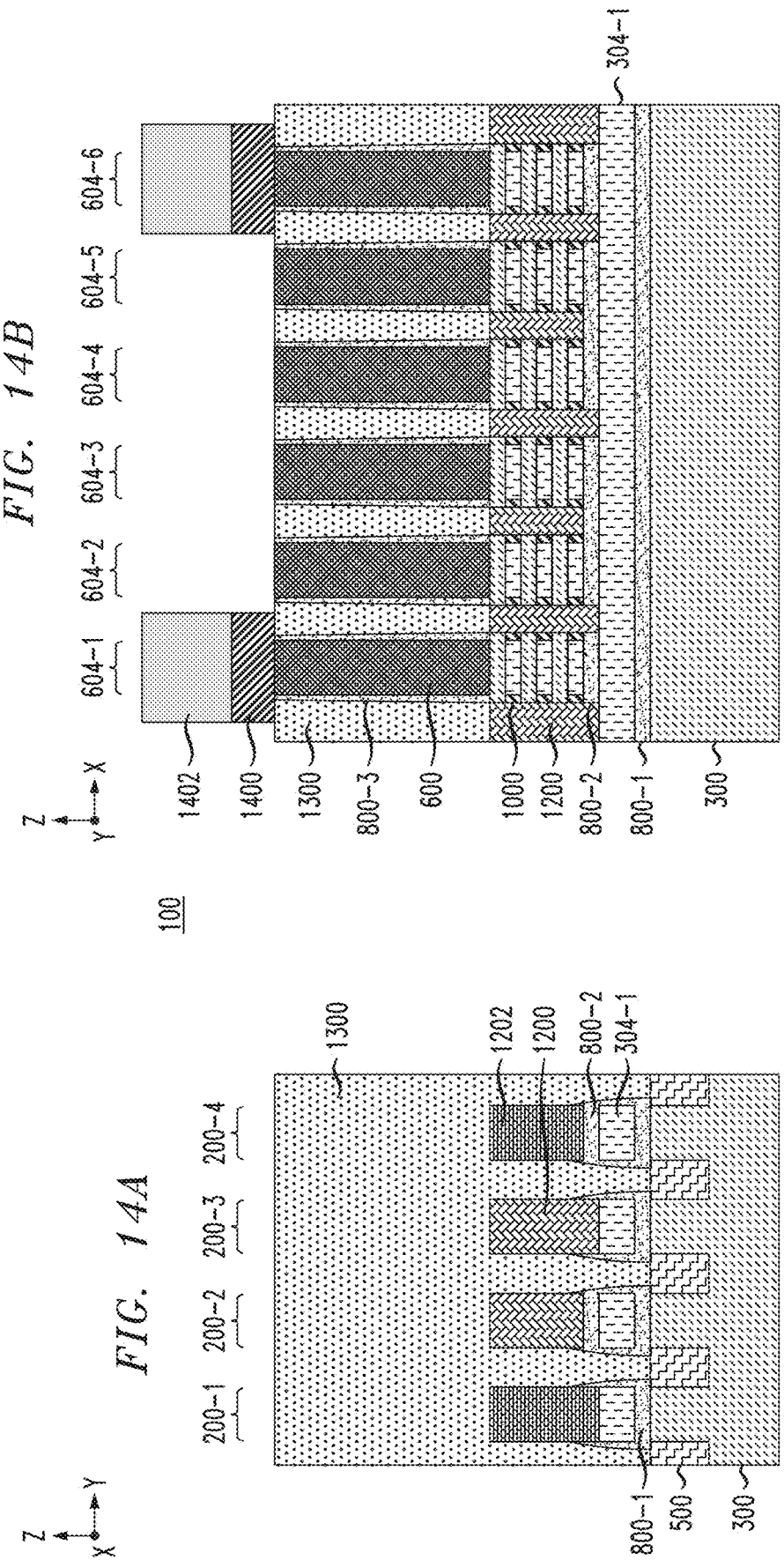

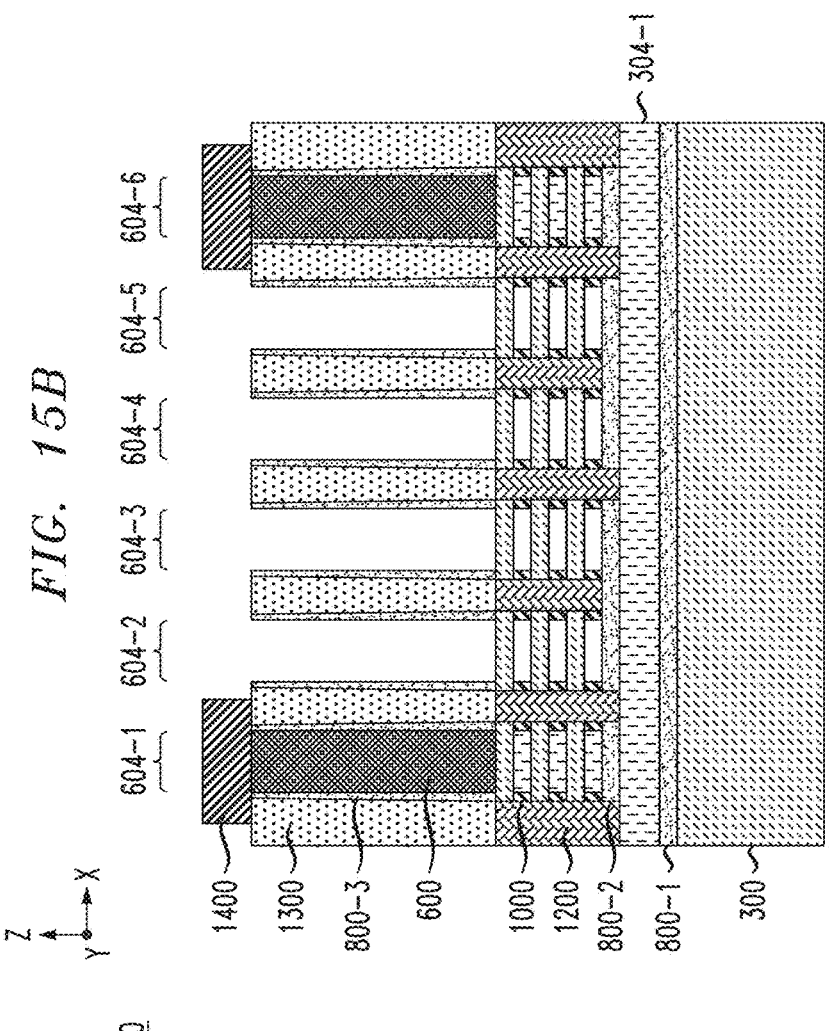
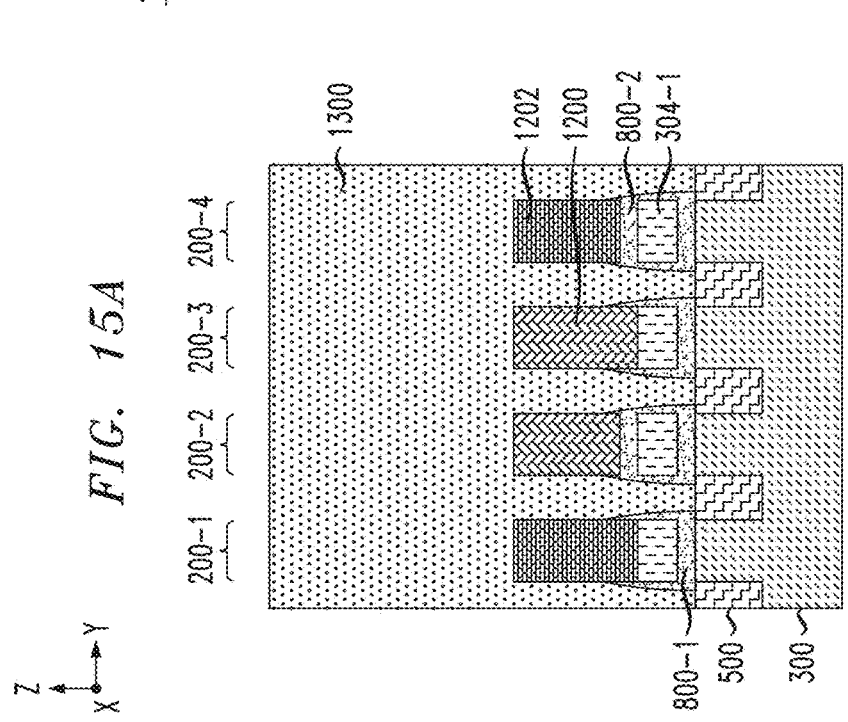

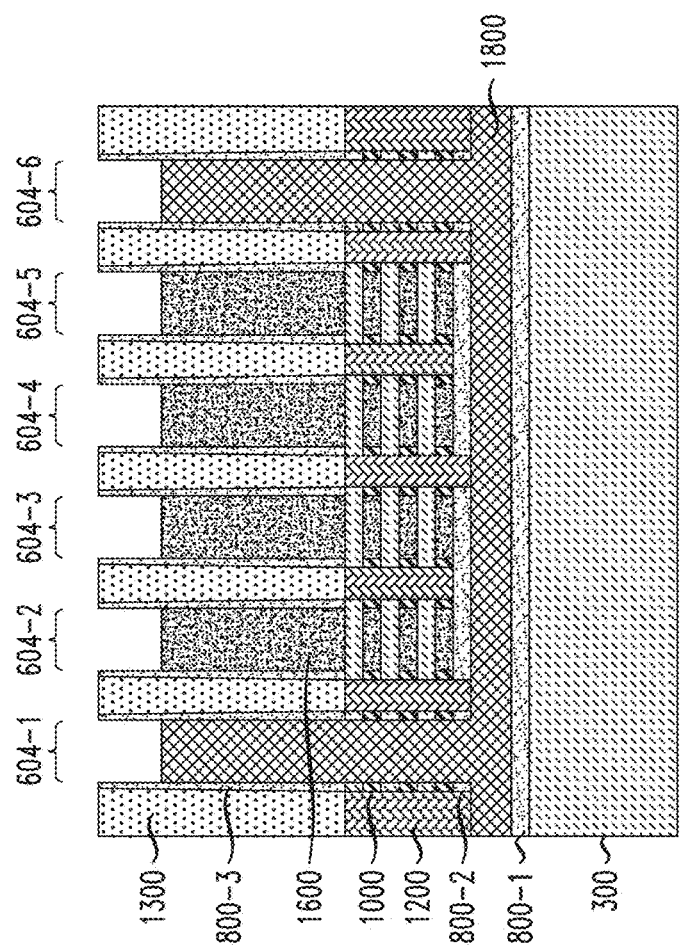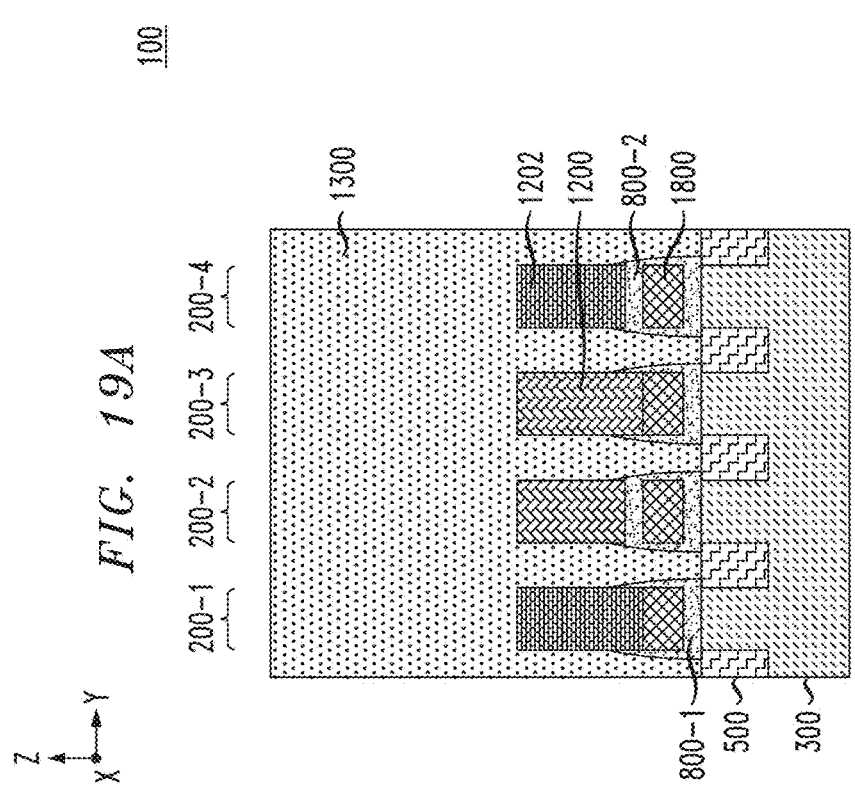

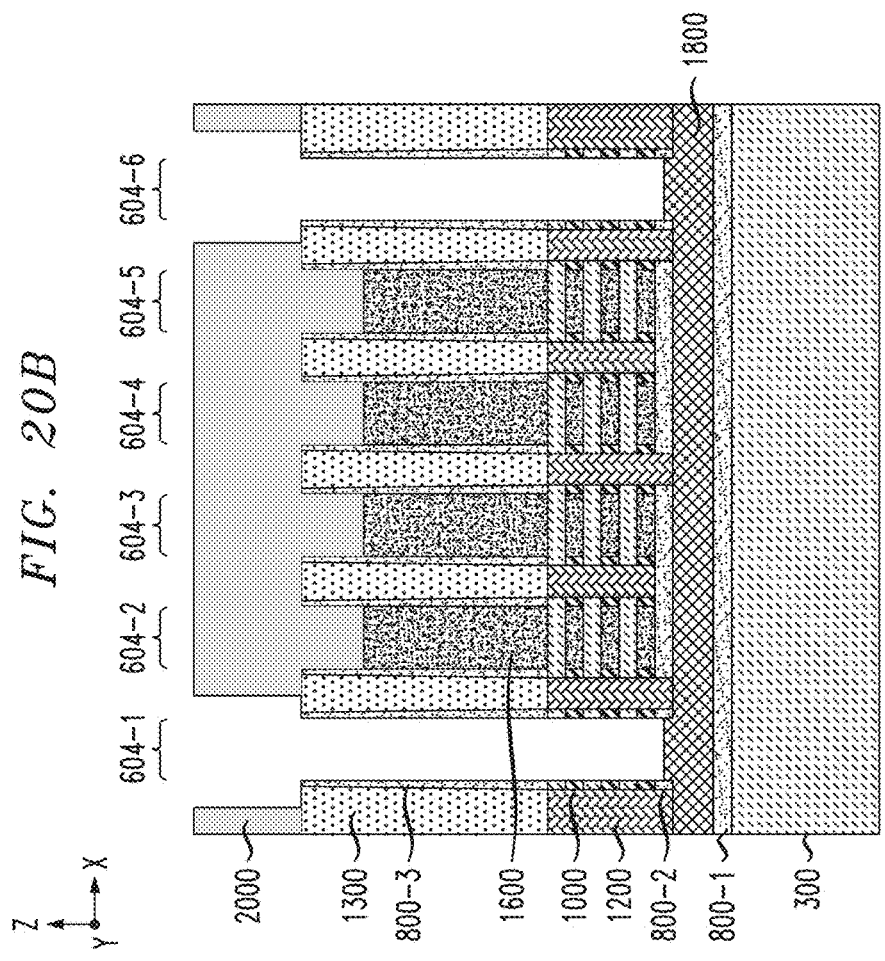
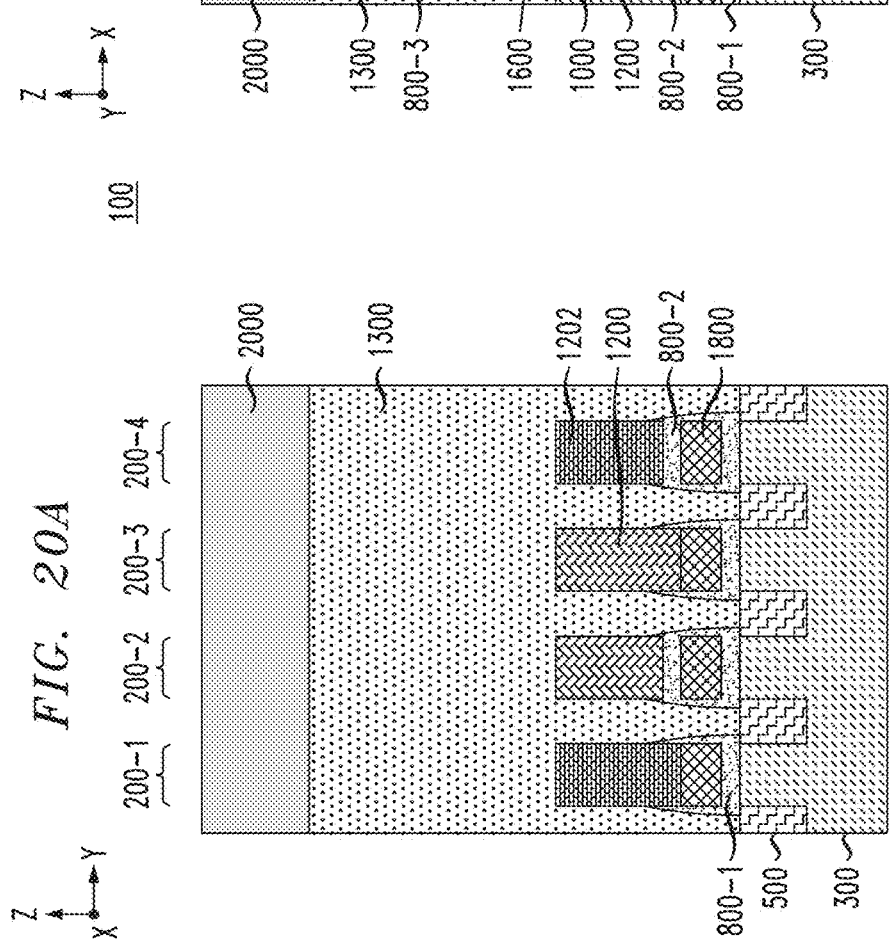
FIG. 20A
FIG. 20B

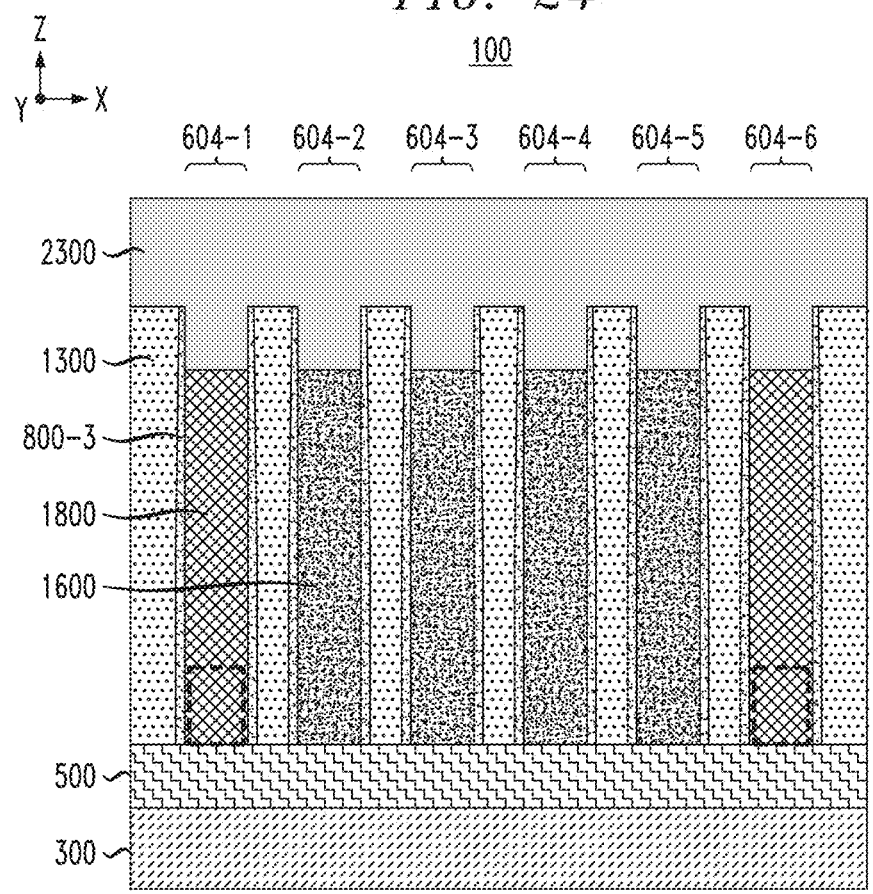

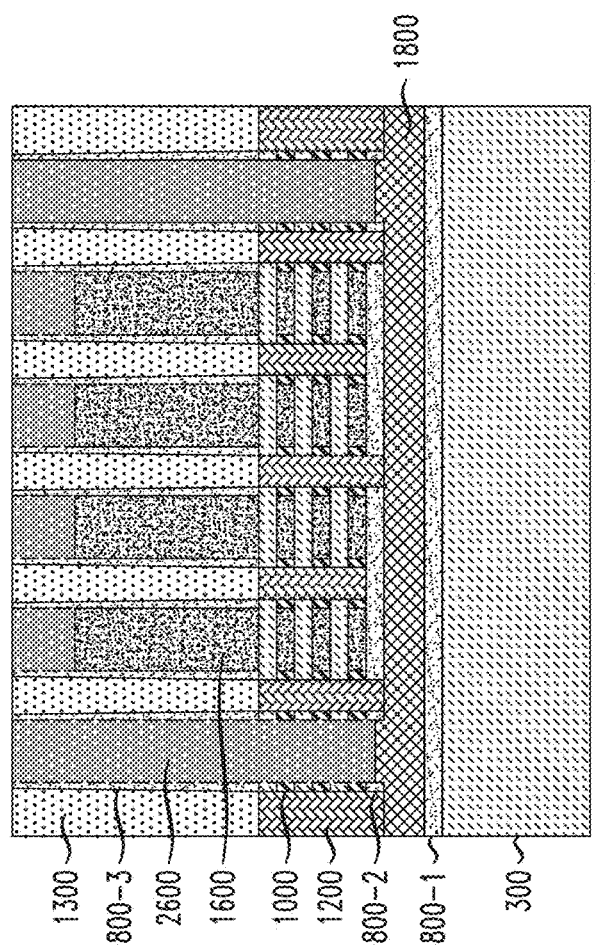
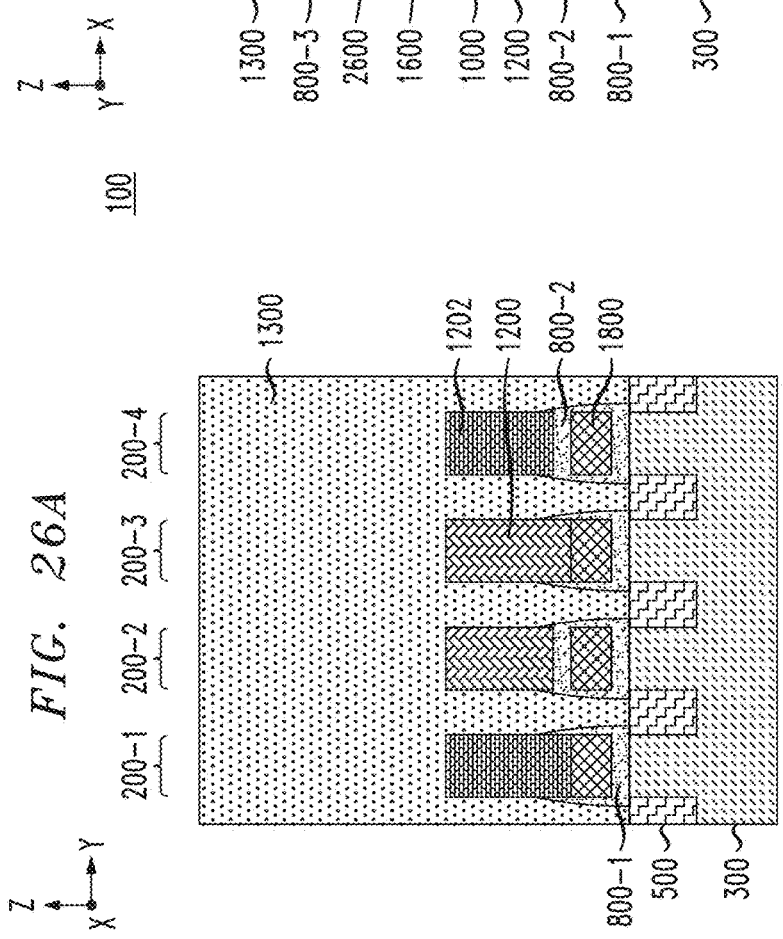

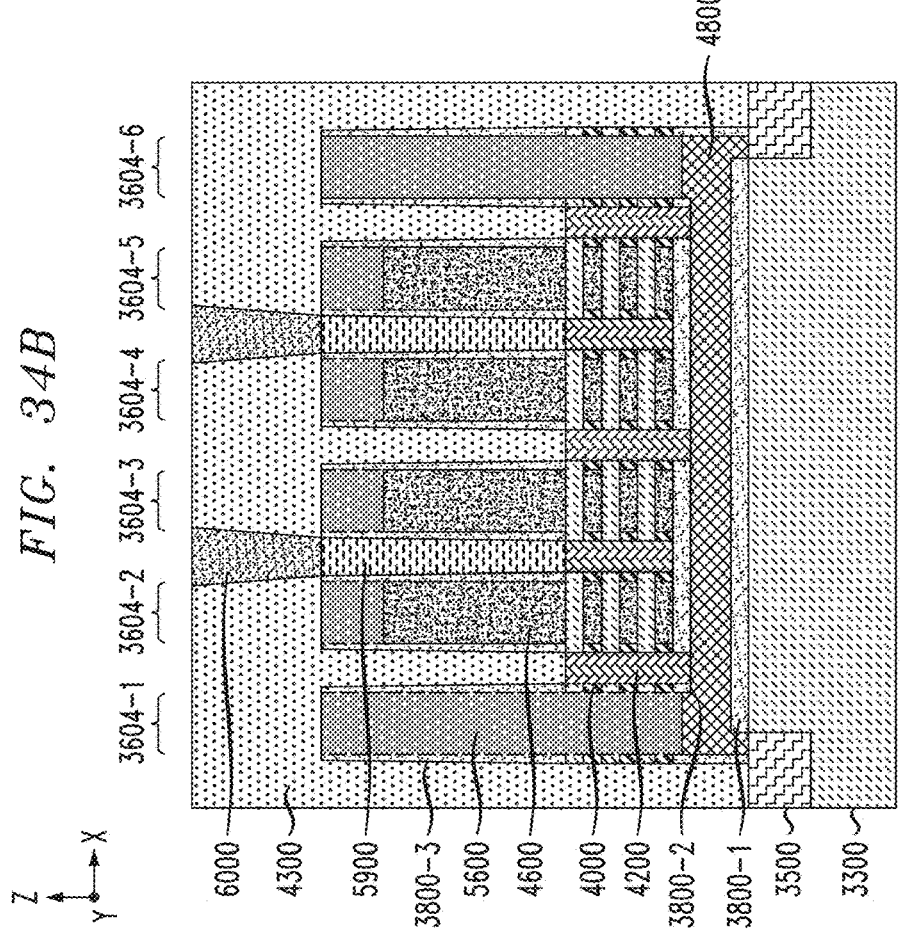
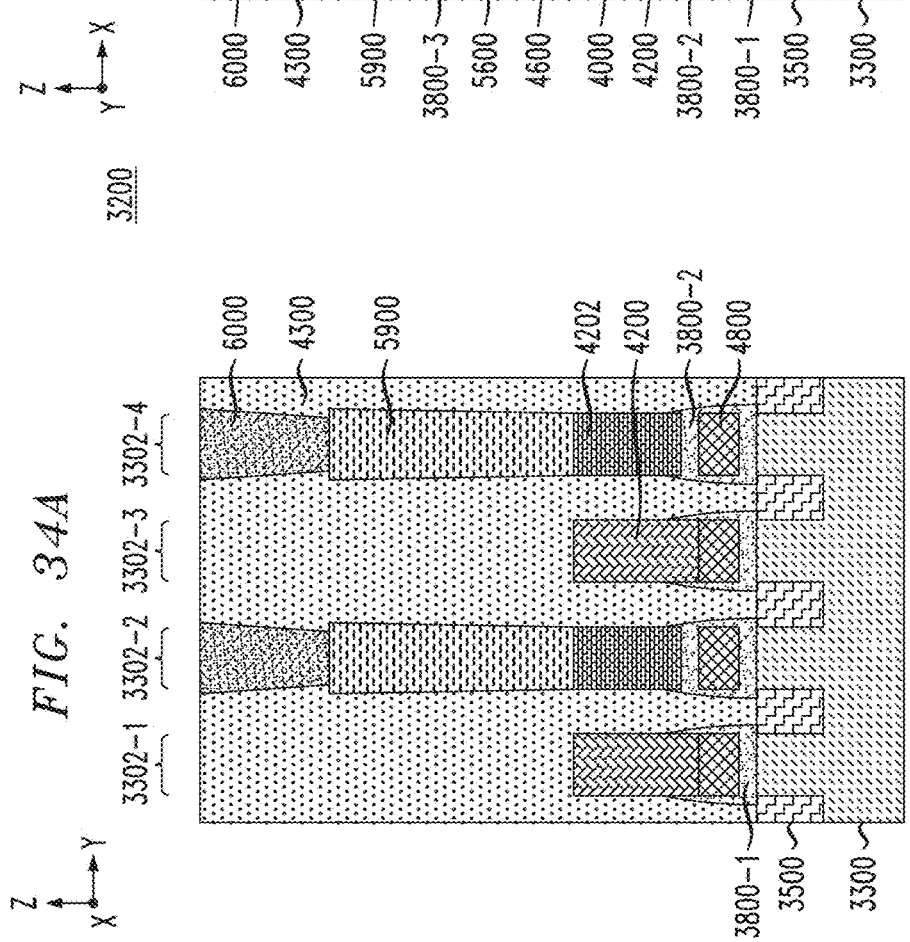

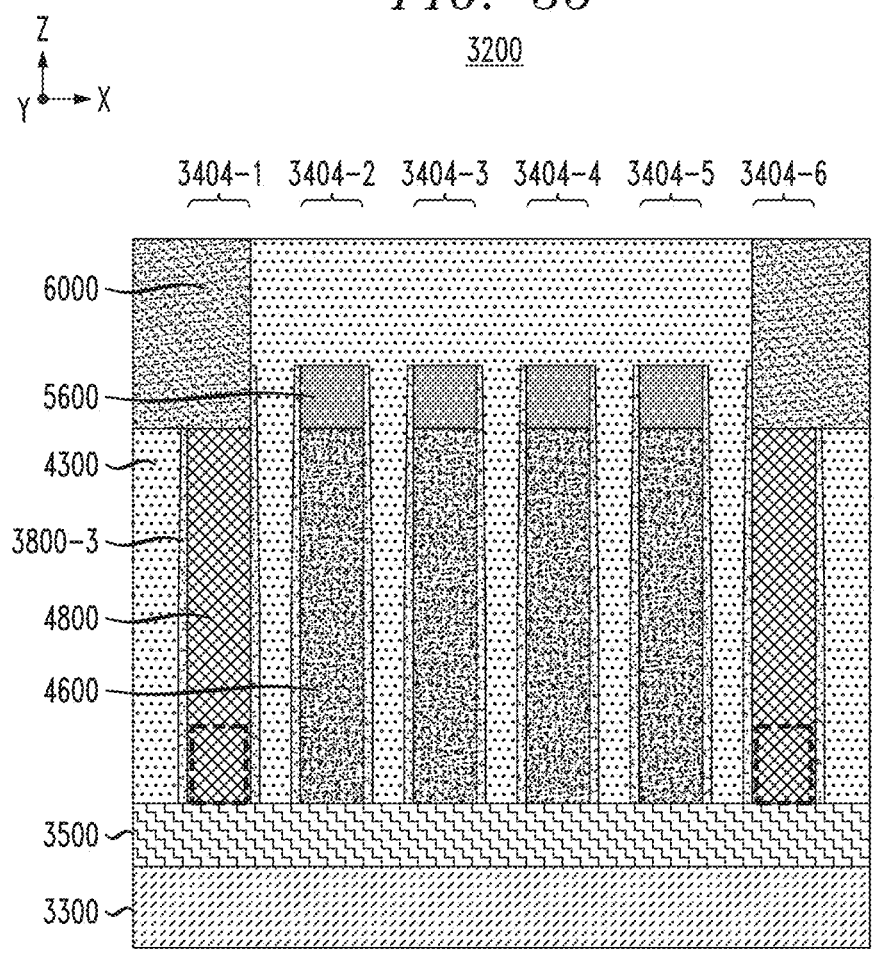

SEMICONDUCTOR STRUCTURES WITH POWER RAIL DISPOSED UNDER ACTIVE GATE

BACKGROUND

Continued innovations in semiconductor process technologies are enabling higher integration densities and device scaling. As the semiconductor industry moves towards the 7-nm technology node and beyond, semiconductor FET device structures must be scaled to smaller dimensions to provide increased device width per footprint area. In this regard, non-planar FET devices such as nanosheet FET devices, nanowire FET devices, vertical FET devices, FinFET devices, etc., are a viable option for continued CMOS scaling. In general, a nanowire FET device comprises a device channel which comprises one or more nanowire layers in a stacked configuration, wherein each nanowire comprises an elongated semiconductor layer that has a width which is substantially the same or slightly larger than a thickness of the elongated semiconductor layer. A nanosheet FET device is similar to a nanowire FET device sheet in that a device channel comprises one or more nanosheet layers in a stacked configuration, but wherein each nanosheet layer has a width which is substantially greater than a thickness of the nanosheet layer. In nanowire/nanosheet FET devices, a common gate structure is formed above and below each nanowire/nanosheet layer in the stacked configuration, thereby increasing the FET device width (or channel width), and thus the drive current, for a given footprint area.

SUMMARY

The disclosed embodiments include semiconductor structures comprising buried power rails (BPRs) and techniques for fabricating semiconductor structures comprising BPRs.

For example, one embodiment includes a semiconductor structure which comprises a gate, a first source/drain region, a second source/drain region and a power rail disposed under the gate, first source/drain region and second source/drain region. The power rail is in electrical contact with the first source/drain region.

Another embodiment includes a semiconductor structure which comprises a first active gate and a diffusion break. The diffusion break comprises an isolation region that is configured to electrically isolate the first active gate from at least a second active gate. The semiconductor structure further comprising a power rail disposed under the first active gate and extending to the diffusion break. The diffusion break comprising a contact electrically coupled to the power rail.

Another embodiment includes a semiconductor structure which comprises a semiconductor substrate, a first dielectric layer disposed on the semiconductor substrate, a power rail disposed on the first dielectric layer, a second dielectric layer disposed on the power rail and a gate extending from the second dielectric layer.

Another embodiment includes a semiconductor structure which comprises a plurality of semiconductor devices. Each of the semiconductor devices is isolated from an adjacent semiconductor device by a dielectric layer. The semiconductor structure further comprises a first diffusion break extending across the plurality of semiconductor devices, a second diffusion break extending across the plurality of semiconductor devices and a plurality of gates extending across the plurality of semiconductor devices. The gates are disposed between the first diffusion break and the second diffusion break. Each semiconductor device comprises a power rail extending between the first diffusion break and the second diffusion break under the plurality of gates.

Another embodiment includes a method of fabricating a semiconductor structure which includes forming a stack structure on a semiconductor substrate. The stack structure comprises a first sacrificial layer, a second sacrificial layer, a third sacrificial layer disposed between the first and second sacrificial layers, a plurality of additional sacrificial layers and a plurality of channel layers. The method further includes forming a plurality of gate structures on the stack structure and replacing the first and second sacrificial layers with a dielectric material to form corresponding first and second dielectric layers. The dielectric material also forms sidewalls on the gate structures. The method further includes etching the plurality of additional sacrificial layers, plurality of channel layers and second dielectric layer between first and second gate structures of the plurality of gate structures to expose the third sacrificial layer through the second dielectric layer and forming a source/drain region between the first and second gate structures and in contact with the third sacrificial layer. The method further includes opening a given gate structure of the plurality of gate structures to expose the third sacrificial layer and replacing the third sacrificial layer with a power rail. The power rail is in contact with the source/drain region.

Other embodiments will be described in the following detailed description of embodiments, which is to be read in conjunction with the accompanying figures.

BRIEF DESCRIPTION OF THE DRAWINGS

FIGS. 5A and 5B are cross-sectional views of the semiconductor structure of FIGS. 4A and 4B at an intermediate stage of fabrication after the formation of a shallow trench isolation (STI) layer, according to an embodiment of the invention.

FIGS. 6A and 6B are cross-sectional views of the semiconductor structure of FIGS. 5A and 5B at an intermediate stage of fabrication after the formation of the gate structures, according to an embodiment of the invention.

FIGS. 7A and 7B are cross-sectional views of the semiconductor structure of FIGS. 6A and 6B at an intermediate stage of fabrication after the removal of the sacrificial nanosheet layers, according to an embodiment of the invention.

FIGS. 8A and 8B are cross-sectional views of the semiconductor structure of FIGS. 7A and 7B at an intermediate stage of fabrication after formation of a dielectric layer, according to an embodiment of the invention.

FIGS. 9A and 9B are cross-sectional views of the semiconductor structure of FIGS. 8A and 8B at an intermediate stage of fabrication after etching of the exposed layers of the nanosheet stack structure including portions of the sacrificial nanosheet layers and portions of the nanosheet channel layers, according to an embodiment of the invention.

FIGS. 10A and 10B are cross-sectional views of the semiconductor structure of FIGS. 9A and 9B at an intermediate stage of fabrication after the etching of the exposed portions of the sacrificial nanosheet layers and formation of inner spacers, according to an embodiment of the invention.

FIGS. 14A and 14B are cross-sectional views of the semiconductor structure of FIGS. 13A and 13B at an intermediate stage of fabrication after the formation of a sacrificial cap and etch mask over the gate structures that correspond to the single diffusion breaks (SDBs), according to an embodiment of the invention.

FIGS. 15A and 15B are cross-sectional views of the semiconductor structure of FIGS. 14A and 14B at an intermediate stage of fabrication after the removal of the dummy gate electrodes and the sacrificial nanosheet layers of the gate structures, according to an embodiment of the invention.

FIGS. 19A and 19B are cross-sectional views of the semiconductor structure of FIGS. 18A and 18B at an intermediate stage of fabrication after the gate conductor layers and BPR are recessed in the gate structures, according to an embodiment of the invention.

FIGS. 20A, 20B, 21 and 22 are cross-sectional views of the semiconductor structure of FIGS. 19A and 19B at an intermediate stage of fabrication after an etch mask is formed that exposes the gate structures and the BPR is etched down to the level of a portion of the dielectric layer to open the gate structures, according to an embodiment of the invention. FIG. 21 is taken along section line C-C of FIG. 2 and FIG. 22 is taken along section line D-D of FIG. 2.

FIGS. 23A, 23B, 24 and 25 are cross-sectional views of the semiconductor structure of FIGS. 20A, 20B, 21 and 22 at an intermediate stage of fabrication after forming an etch mask and performing a gate cut to separate the BPR between the n-type and p-type semiconductor devices, according to an embodiment of the invention.

FIGS. 26A, 26B, 27 and 28 are cross-sectional views of the semiconductor structure of FIGS. 23A, 23B, 24 and 25 at an intermediate stage of fabrication after removal of the etch mask and formation of ILD layer in the exposed portions of gate structures and between pillars of the BPR to electrically isolate the pillars from each other, according to an embodiment of the invention.

FIGS. 34A, 34B, 35 and 36 are cross-sectional views of the semiconductor structure of FIG. 33 at an intermediate stage of fabrication that is similar to the stage of fabrication found in FIGS. 29A, 29B, 30 and 31, according to an embodiment of the invention. FIG. 34A is taken along section line A'-A' of FIG. 33, FIG. 34B is taken along section line B'-B' of FIG. 33, FIG. 35 is taken along section line C'-C' of FIG. 33 and FIG. 36 is taken along section line D'-D' of FIG. 33.

DETAILED DESCRIPTION

Figure 1:
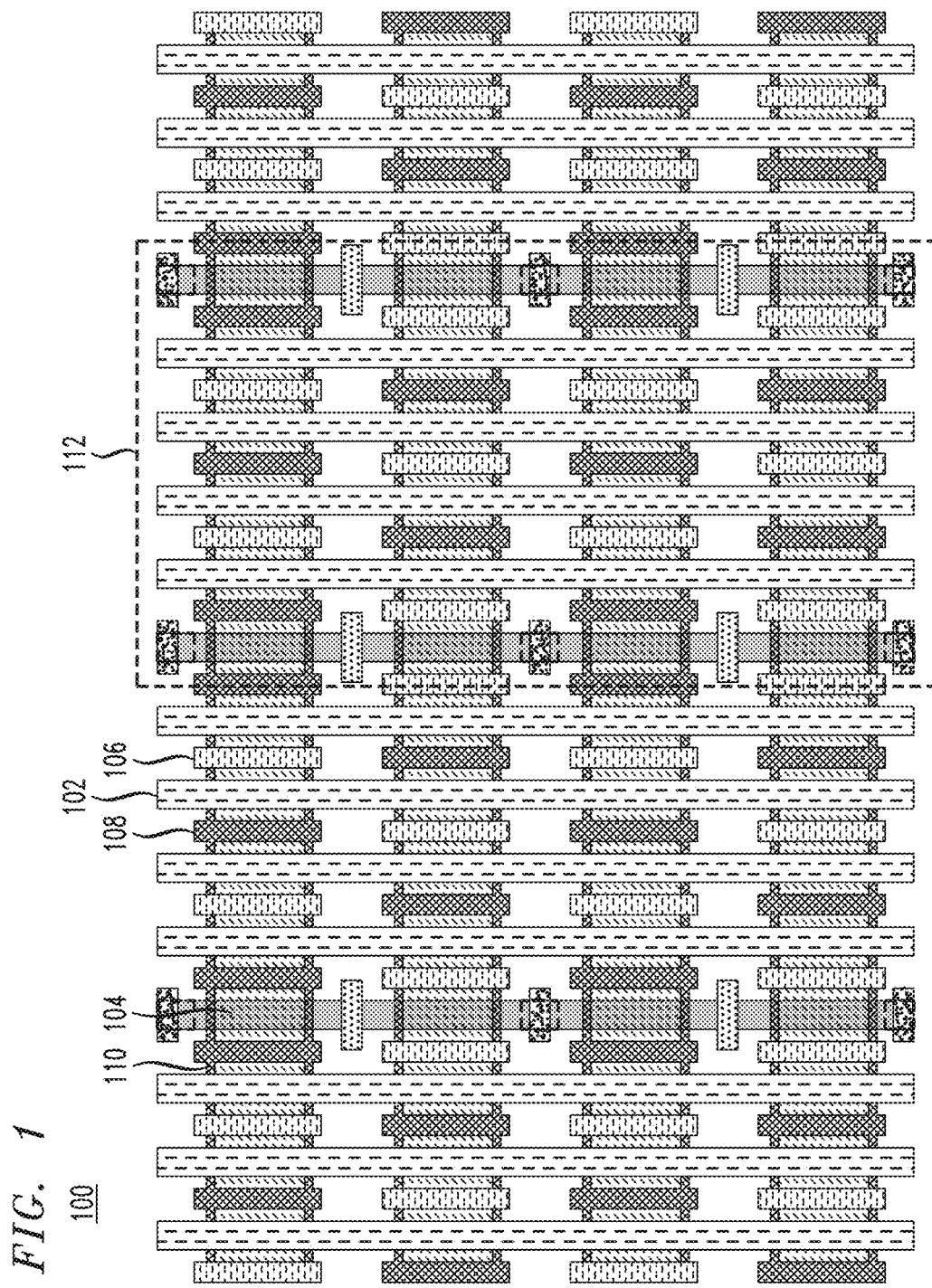
FIG. 1 is a schematic top-down view of a semiconductor structure according to an embodiment of the invention.

Embodiments of the invention will now be described in further detail below. Devices and methods are provided to fabricate nanosheet field-effect transistor devices having buried power rails under active devices utilizing diffusion break contacts.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor device structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

To provide spatial context to the different structural orientations of the semiconductor device structures shown throughout the drawings, XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

FIG. 1 is a schematic top-down view (X-Y plane) of a semiconductor integrated circuit structure 100 according to a first embodiment, also referred to herein as semiconductor structure 100. For the sake of clarity, some elements of the semiconductor structure 100 are not shown in FIG. 1. Semiconductor structure 100 comprises groups of active gates 102 separated by single diffusion breaks (SDBs) 104 that each comprise an inactive gate. As will be described and illustrated in more detail below with reference to FIGS. 2-31, source/drain regions associated with the active gates 102 are supplied with power via either top-down contacts 106 or bottom-up contacts 108. The bottom-up contacts 108 are electrically connected to buried power rails (BPRs) 110 disposed beneath the source/drain regions. For example, in some embodiments, a source/drain region on one side of an active gate 102 is connected to a top-down contact 106 while a source/drain region on the other side of the active gate 102 is connected to the BPR 110 via a bottom-up contact 108. While described with reference to top-down contacts and bottom-up contacts, semiconductor structure 100 may be formed with contacts in any direction. The use of both top-down contacts 106 and bottom-up contacts 108 provides reduced tip to tip spacing which reduces the occurrence of shorts and allows for improved source/drain density.

Figure 2:
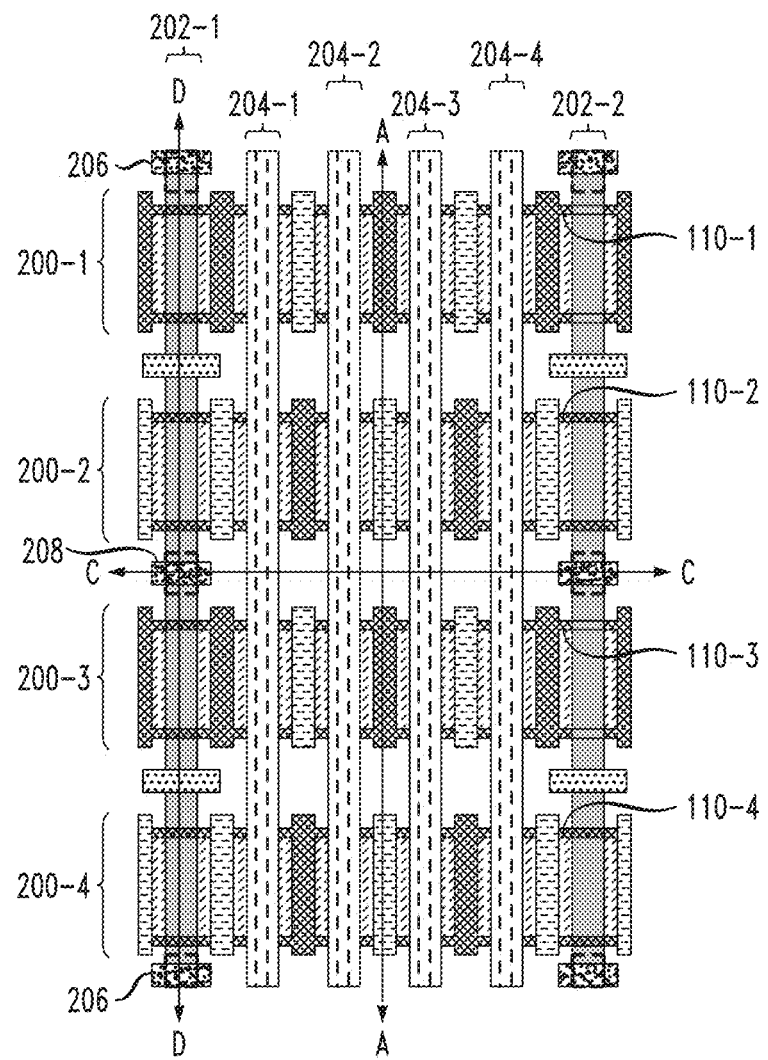
FIG. 2 is a schematic top-down view of a portion of the semiconductor structure of FIG. 1 according to an embodiment of the invention.

FIG. 2 is a schematic top-down view (X-Y plane) of a portion 112 of the semiconductor structure 100 and will be utilized to further illustrate the features of semiconductor structure 100. As seen in FIG. 2, semiconductor structure 100 comprises semiconductor regions 200-1, 200-2, 200-3 and 200-4, collectively and individually referred to as semiconductor regions 200, across which SDBs 202-1 and 202-2, collectively and individually referred to as SDBs 202, and active gates 204-1, 204-2, 204-3 and 204-4, collectively and individually referred to as active gates 204, are formed. Each semiconductor region 200-1, 200-2, 200-3 and 200-4 comprises a corresponding BPR 110-1, 110-2, 110-3 and 110-4, collectively and individually referred to as BPRs 110.

While illustrated as having four semiconductor regions 200 with four active gates 204 between two SDBs 202, any number of semiconductor regions 200, SDBs 202 and active gates 204 may be included with any number of active gates 204 disposed between each pair of SDBs 202. In some embodiments, for example, semiconductor regions 200 may be formed as nFET or pFET devices. In some embodiments, semiconductor regions 200-1 and 200-4 may comprise pFET devices while semiconductor regions 200-2 and 200-3 may comprise nFET devices. In other embodiments, the semiconductor regions 200 may alternate between nFET and pFET devices where, e.g., semiconductor regions 200-1 and 200-3 comprise pFET devices while semiconductor regions 200-2 and 200-4 comprise nFET devices or vice versa.

The BPR 110 for each semiconductor region 200 is supplied with power via one or more corresponding top-down contacts 206 or 208 in the SDBs 202. For example, top-down contacts 206 may be set to a first voltage while top-down contacts 208 may be set to a second voltage that is different than the first voltage. Top-down contacts 206 supply power to the BPRs 110 of the semiconductor regions 200-1 and 200-4 while top-down contacts 208 supply power to the BPRs 110 of the semiconductor regions 200-2 and 200-3. The use of top-down contacts 206 and 208 in the SDBs 202 for supplying power to the BPRs 110 allows for reduced N-to-N and P-to-P spacing since the BPRs 110 are self-aligned with the semiconductors devices and formed under the active gates instead of in the shallow trench isolation (STI) layer. FIG. 2 also defines cross sections A-A, B-B, C-C and D-D which will be utilized in FIGS. 3-31.

FIGS. 3A through 3I schematically illustrate an example method for fabricating semiconductor structure 100 according to an illustrative embodiment.

Figure 3A:
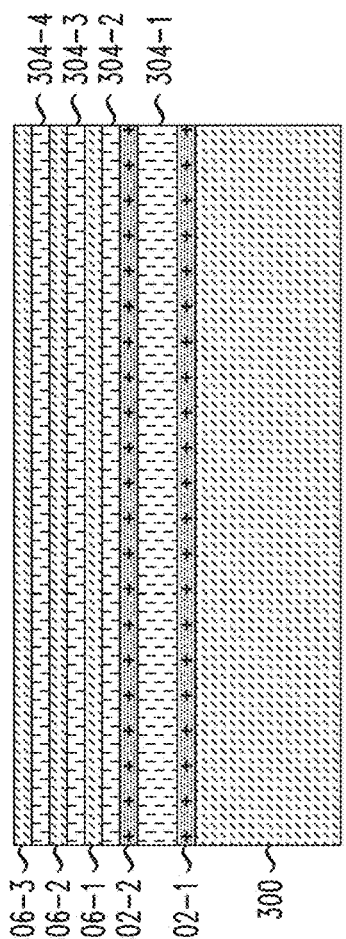
FIGS. 3A and 3B are a schematic cross-sectional side views of the semiconductor structure of FIG. 2 at an intermediate stage of fabrication taken along section lines A-A and B-B of FIG. 2, respectively, according to an embodiment of the invention.
Figure 3B:
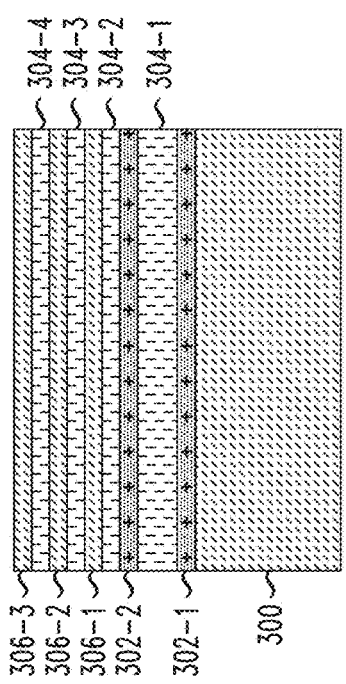

FIGS. 3A and 3B are cross-sectional views of the semiconductor structure 100 at an intermediate stage of fabrication. FIG. 3A is a schematic side view (Y-Z plane) of the semiconductor structure 100 taken along section line A-A of FIG. 2 and FIG. 3B is a schematic cross-sectional side view (X-Z plane) of the semiconductor structure 100 taken along section line B-B of FIG. 2. As illustrated in FIGS. 3A and 3B, the semiconductor structure 100 comprises a semiconductor substrate 300 and a nanosheet stack structure formed on the semiconductor substrate 300. The nanosheet stack structure comprises a stack of semiconductor layers 302-1, 302-2, 304-1, 304-2, 304-3, 304-4, 306-1, 306-2 and 306-3. In some embodiments, semiconductor structure 100 comprises an oxide layer disposed between the semiconductor substrate 300 and the nanosheet stack structure which may, for example, provide etch selectivity between the layers of the nanosheet stack structure and the semiconductor substrate 300.

While the semiconductor substrate 300 is illustrated as a generic substrate layer, it is to be understood that the semiconductor substrate 300 may comprise one of different types of semiconductor substrate structures and materials. For example, in one embodiment, the semiconductor substrate 300 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g., III-V), etc. In another embodiment, the semiconductor substrate 300 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of a front-end-of-line (FEOL) structure.

The stack of semiconductor layers 302-1 through 306-3 of the nanosheet stack structure comprise sacrificial nanosheet layers 302-1, 302-2, 304-1, 304-2, 304-3 and 304-4 and nanosheet channel layers 306-1, 306-2 and 306-3. Sacrificial nanosheet layers 302-1 and 302-2 are also referred to collectively and individually as sacrificial nanosheet layers 302. Sacrificial nanosheet layers 304-1, 304-2, 304-3 and 304-4 are also referred to collectively and individually as sacrificial nanosheet layers 304. Nanosheet channel layers 306-1, 306-2 and 306-3 are also referred to collectively and individually as nanosheet channel layers 306. Each nanosheet channel layer 306 is disposed between a pair of the sacrificial nanosheet layers 304 in the nanosheet stack structure. The stack of semiconductor layers 302-1 through 306-3 comprise epitaxial semiconductor layers that are sequentially grown.

For example, the sacrificial nanosheet layer 302-1 is epitaxially grown on a surface of the semiconductor substrate 300, the sacrificial nanosheet layer 304-1 is epitaxially grown on the sacrificial nanosheet layer 302-1, the sacrificial nanosheet layer 302-2 is epitaxially grown on the sacrificial nanosheet layer 304-1, the sacrificial nanosheet layer 304-2 is epitaxially grown on the sacrificial nanosheet layer 302-2, the nanosheet channel layer 306-1 is epitaxially grown on the sacrificial nanosheet layer 304-2, the sacrificial nanosheet layer 304-3 is epitaxially grown on the nanosheet channel layer 306-1, the nanosheet channel layer 306-2 is epitaxially grown on the sacrificial nanosheet layer 304-3, the sacrificial nanosheet layer 304-4 is epitaxially grown on the nanosheet channel layer 306-2 and the nanosheet channel layer 306-3 is epitaxially grown on the sacrificial nanosheet layer 304-4.

In one embodiment, the epitaxial semiconductor layers 302-1 through 306-3 comprise single crystal (monocrystalline) semiconductor materials, which are epitaxially grown using known methods such as chemical vapor deposition (CVD), metal-organic chemical vapor deposition (MOCVD), low pressure chemical vapor deposition (LPCVD), molecular beam epitaxy (MBE), vapor-phase epitaxy (VPE), liquid-phase epitaxy (LPE), metal organic molecular beam epitaxy (MOMBE), rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), metal-organic chemical vapor deposition (MOCVD), or other known epitaxial growth techniques which are suitable for the given process flow. The types of materials that are utilized to form the epitaxial semiconductor layers 302-1 through 306-3 will depend on various factors such as the type of nanosheet FET device (p-type, or n-type), and the desired level of etch selectivity between the spacer and semiconductor layers, as well as providing sufficient lattice matching between the materials of the spacer and semiconductor layers to ensure proper (e.g., defect-free) epitaxial growth of the crystalline semiconductor layers 302-1 through 306-3.

For example, in one embodiment, the nanosheet channel layers 306 are formed of epitaxial silicon (Si), which is suitable to serve as semiconductor channel layers for a nanosheet FET device. When the nanosheet channel layers 306 are formed of crystalline Si, the sacrificial nanosheet layers 302 and 304, which serve as sacrificial layers that are subsequently etched away to release the nanosheet channel layers 306, can be formed of an epitaxial silicon-germanium (SiGe) alloy. This allows the epitaxial SiGe material of the sacrificial nanosheet layers 302 and 304 to be etched selective to the epitaxial Si material of the nanosheet channel layers 306 in a subsequent process step to "release" the nanosheet channel layers 306. In some embodiments, the Ge concentration of one or more of the sacrificial nanosheet layers 302 and 304 may be varied to provide etch selectivity between the sacrificial nanosheet layers 302 and 304. In other embodiments, Si, SiGe or other materials may be utilized for the nanosheet channel layers 306 and sacrificial nanosheet layers 302 and 304.

While the nanosheet stack structure is shown to include three nanosheet channel layers 306, in other embodiments, the nanosheet stack structure can be fabricated with more or less than three nanosheet channel layers. Similarly, while the nanosheet stack structure is shown to include two sacrificial nanosheet layers 302 and four sacrificial nanosheet layers 304, in other embodiments, the nanosheet stack structure can be fabricated with more or less sacrificial nanosheet layers 302 and 304.

In some embodiments, the sacrificial nanosheet layers 302 may comprise a SiGe alloy having a high percentage of Ge while sacrificial nanosheet layers 304 may comprise SiGe alloys having a lower percentage of Ge than the sacrificial nanosheet layers 302, such that the sacrificial nanosheet layers 302 are selectively etchable relative to the sacrificial nanosheet layers 304. For example, in some embodiments, the sacrificial nanosheet layers 302 may comprise a SiGe alloy having a range of about 50% to about 90% Ge, sacrificial nanosheet layers 304 may comprise a SiGe alloy having a range of about 25% to 40% Ge and nanosheet channel layers 306 may comprise Si or an SiGe alloy having a range of about 5% to about 15% Ge where the sacrificial nanosheet layers 302 and sacrificial nanosheet layers 304 are selectively etchable relative to each other and to nanosheet channel layers 306. In one example embodiment, sacrificial nanosheet layers 302 comprise an SiGe alloy having about 60% Ge, sacrificial nanosheet layers 304 comprise an SiGe alloy having about 25% Ge and nanosheet channel layers 306 comprise Si. In other embodiments, sacrificial nanosheet layers 302, sacrificial nanosheet layers 304 and nanosheet channel layers 306 may comprise any other concentrations of Ge or other alloys of Si or other semiconductor materials.

In some embodiments, sacrificial nanosheet layer 304-1 may comprise a different SiGe alloy than sacrificial nanosheet layers 304-2, 304-3 and 304-4. For example, in some embodiments, sacrificial nanosheet layers 302 comprise an SiGe alloy having 60% Ge, sacrificial nanosheet layer 304-1 comprises an SiGe alloy having 15% Ge, sacrificial nanosheet layers 304-2, 304-3 and 304-4 comprise an SiGe alloy having 30% Ge and nanosheet channel layers 306 comprise Si. In this manner, sacrificial nanosheet layers 304-2, 304-3 and 304-4 may be selectively etched relative to sacrificial nanosheet layer 304-1.

With continued reference to FIGS. 3A and 3B, the sacrificial nanosheet layers 304-2, 304-3 and 304-4 may be formed with a thickness that defines the spacing size above and below the nanosheet channel layers 306-1, 306-2 and 306-3, in which high-k dielectric material and work function metal will be formed. The size of the spacing and the type of WFM material(s) to be formed in the spaces above and below the nanosheet channel layers 306 defines, in part, the threshold voltage (Vt) of the nanosheet FET device. In one embodiment, the thickness of the sacrificial nanosheet layers 304-2 through 304-4 is in a range of about 8 nm to about 15 nm. In some embodiments, sacrificial nanosheet layers 302 may be formed with a similar thickness to sacrificial nanosheet layers 304.

Sacrificial nanosheet layer 304-1 may be formed between sacrificial nanosheet layers 302-1 and 302-2 with a thickness that is greater than the other sacrificial nanosheet layers 304-2, 304-3 and 304-4. This is because the sacrificial nanosheet layer 304-1 will be replaced with BPR 110 during fabrication.

In one embodiment, the thickness of the nanosheet channel layers 306 is in a range of about 4 nm to about 8 nm, although the nanosheet channel layers 306 can be formed with other thickness ranges, depending on the application.

Figures 4A, 4B:
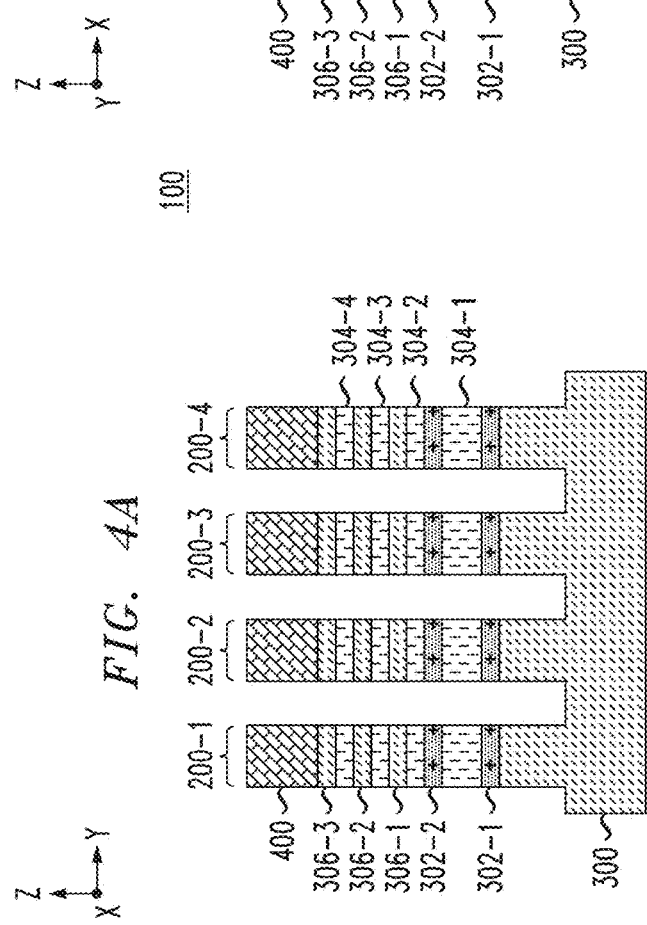
FIGS. 4A and 4B are cross-sectional views of the semiconductor structure of FIGS. 3A and 3B at an intermediate stage of fabrication after the etching is performed to form the semiconductor regions, according to an embodiment of the invention.

FIGS. 4A and 4B are cross-sectional views of the semiconductor structure 100 at an intermediate stage of fabrication after the etching is performed to form the semiconductor regions 200. FIG. 4A is a schematic side view (Y-Z plane) of the semiconductor structure 100 taken along section line A-A of FIG. 2 and FIG. 4B is a schematic cross-sectional side view (X-Z plane) of the semiconductor structure 100 taken along section line B-B of FIG. 2. As illustrated in FIGS. 4A and 4B, etching is performed on semiconductor layers 302-1 through 306-3 and semiconductor substrate 300 to form the semiconductor regions 200-1, 200-2, 200-3 and 200-4 using standard etching techniques.

For example, a nanosheet capping layer 400 may be formed over the nanosheet stack structure by depositing a layer of dielectric material such as silicon nitride (SiN), silicon carbon nitride (SiCN), silicon oxynitride (SiON), boron nitride (BN), silicon boron nitride (SiBN), siliconborocarbonitride (SiBCN), silicon oxycarbonitride (SiOCN), or other similar materials commonly used to form gate capping layers and gate sidewall spacers. The hard mask layer is then patterned to form the nanosheet capping layer 400. The nanosheet capping layer 400 is utilized as an etch hardmask to anisotropically etch, e.g., RIE, and remove the layers of the nanosheet stack structure and form the semiconductor regions 200 as shown in FIG. 4. As seen in FIG. 4A, the etching process also forms trenches at a depth below the upper surface of the semiconductor substrate 300.

FIGS. 5A and 5B are cross-sectional views of the semiconductor structure 100 at an intermediate stage of fabrication after the formation of a shallow trench isolation (STI) layer 500. FIG. 5A is a schematic side view (Y-Z plane) of the semiconductor structure 100 taken along section line A-A of FIG. 2 and FIG. 5B is a schematic cross-sectional side view (X-Z plane) of the semiconductor structure 100 taken along section line B-B of FIG. 2. The STI layer 500 is formed of any type of insulating material, such an oxide material, which is suitable for the given fabrication process flow. An insulating material (e.g., silicon oxide) is be deposited and patterned using known techniques to form the STI layer 500 in the trenches of the semiconductor substrate 300. For example, the insulating material may be deposited on the semiconductor structure 100 and planarized down to the nanosheet capping layer 400 followed by a combination of dry and wet etch processes to selectively recess the insulating material down below the nanosheet stack structure. The nanosheet capping layer 400 may then be removed, e.g., using an RIE process that is selective to the materials of the semiconductor layers 302-1 through 306-3 of the nanosheet stack structure, the semiconductor substrate 300 and STI layer 500, a CMP process or another similar process.

FIGS. 6A and 6B are cross-sectional views of the semiconductor structure 100 at an intermediate stage of fabrication after the formation of gate structures 604-1 through 604-6. FIG. 6A is a schematic side view (Y-Z plane) of the semiconductor structure 100 taken along section line A-A of FIG. 2 and FIG. 6B is a schematic cross-sectional side view (X-Z plane) of the semiconductor structure 100 taken along section line B-B of FIG. 2.

As part of the formation of gate structures 604-1 through 604-6, a dummy gate electrode material and a gate capping material are formed over the semiconductor device structure and patterned, e.g., using standard deposition and lithographic processes.

For example, the dummy gate electrode layer may be formed by a blanket deposition of a sacrificial material such as polysilicon or amorphous silicon material over the semiconductor structure 100. In some embodiments, a conformal layer of silicon oxide may be deposited prior to the formation of the dummy gate electrode layer. A CMP process is performed to planarize the layer of sacrificial material, and a hard mask layer is formed on the planarized surface of the polysilicon layer by depositing a layer of dielectric material such as silicon nitride (SiN), silicon carbon nitride (SiCN), silicon oxynitride (SiON), boron nitride (BN), silicon boron nitride (SiBN), siliconborocarbonitride (SiBCN), silicon oxycarbonitride (SiOCN), or other similar materials commonly used to form gate capping layers.

The hard mask layer is then patterned to form gate capping layers 602 of the gate structures 604, which define an image of the dummy gate structure. Gate structures 604-1 through 604-6 are also collectively and individually referred to herein as gate structure(s) 604.

The gate capping layers 602 are then utilized as an etch hardmask to anisotropically etch (e.g., RIE) the sacrificial polysilicon layer to thereby form the dummy gate electrodes 600 of the gate structures 604. In illustrative embodiments, the etching chemistry is selective to the materials of the nanosheet stack structure (including nanosheet channel layer 306-3) and the STI layer 500.

FIGS. 7A and 7B are cross-sectional views of the semiconductor structure 100 at an intermediate stage of fabrication after the removal of the sacrificial nanosheet layers 302-1 and 302-2. FIG. 7A is a schematic side view (Y-Z plane) of the semiconductor structure 100 taken along section line A-A of FIG. 2 and FIG. 7B is a schematic cross-sectional side view (X-Z plane) of the semiconductor structure 100 taken along section line B-B of FIG. 2.

As illustrated in FIGS. 7A and 7B, one or more etch processes are utilized to remove the sacrificial nanosheet layers 302. In some embodiments, dry or wet etch processes may be utilized to etch the sacrificial nanosheet layers 302 without removing the other semiconductor layers of the nanosheet stack structure. For example, the etch chemistry and process may be selective to the materials of the semiconductor substrate 300, STI layer 500, semiconductor layers 304 and 306, dummy gate electrodes 600 and gate capping layers 602. For example, the etch chemistry may be configured to remove the SiGe alloy concentration of the sacrificial nanosheet layers 302, e.g., 60%, while being selective to the lower concentrations of Ge found in sacrificial nanosheet layers 304, e.g., 25%, and nanosheet channel layers 306 if present an SiGe alloy. In some embodiments, a dry vapor phase etch process may be utilized to remove the sacrificial nanosheet layers 302. In one embodiment, the SiGe material of the sacrificial nanosheet layers 302 can be selectively etched (with high etch selectivity) using a gas phase HCl (hydrochloric acid) or wet etch solution to laterally etch the SiGe material of the sacrificial nanosheet layers 302 selective to the Si and SiGe material of the sacrificial nanosheet layers 304 and nanosheet channel layers 306. The gas phase HCl (hydrochloric acid) provides high etch selectivity when, for example, the sacrificial nanosheet layers 304 and the nanosheet channel layers 306 are formed of Si or SiGe with a lower Ge concentration than the SiGe material of the sacrificial nanosheet layers 302.

FIGS. 8A and 8B are cross-sectional views of the semiconductor structure 100 at an intermediate stage of fabrication after formation of portions 800-1, 800-2 and 800-3 of a dielectric layer, collectively and individually referred to as dielectric layer 800. FIG. 8A is a schematic side view (Y-Z plane) of the semiconductor structure 100 taken along section line A-A of FIG. 2 and FIG. 8B is a schematic cross-sectional side view (X-Z plane) of the semiconductor structure 100 taken along section line B-B of FIG. 2.

For example, a dielectric layer 800 is formed on the semiconductor structure 100 to fill the space left by the removal of sacrificial nanosheet layers 302 and to form sidewalls for the gate structures 604 on the lateral surfaces of the dummy gate electrodes 600 and gate capping layers 602. For example, the dielectric layer 800 may be formed by depositing one or more conformal layers of dielectric material over the exposed surfaces of the semiconductor structure 100 including the exposed surfaces of the nanosheet stack structure, dummy gate electrodes 600 and gate capping layers 602. The dielectric material is also deposited on the surfaces of the semiconductor substrate 300 and sacrificial nanosheet layers 304 that were exposed by removal of the sacrificial nanosheet layers 302. In some embodiments, the dielectric layer 800 is formed of a low-k dielectric material. For example, the dielectric layer 800 can be formed of SiN, SiBCN, SiOCN, SiOC, $SiO_2$ or any other type of dielectric material (e.g., a low-k dielectric material having a k of less than 5) which is commonly used to form insulating gate sidewall spacers of FET devices. In one embodiment, the dielectric material is conformally deposited using a highly conformal deposition process, such as ALD, to ensure that the recesses are sufficiently filled with dielectric material. Other deposition methods such as CVD and PVD can be utilized to deposit a highly conformal layer of dielectric material to fill the recesses.

The conformal layer of dielectric material can be etched back using an anisotropic etch process with reduced overetch. The anisotropic etch process maintains the dielectric layer 800 as sidewalls on the exposed portions of the sacrificial nanosheet layers 304-1 and 304-2 while removing the dielectric material from the surfaces of sacrificial nanosheet layers 304-3 and 304-4 and the nanosheet channel layers 306 of the semiconductor devices 200, as shown in FIG. 8A. In some embodiments, only a portion of sacrificial nanosheet layer 304-2 may be covered by the dielectric layer 800. The anisotropic etch process also maintains the dielectric layer 800 as sidewalls on the gate structures 604 while exposing portions of the nanosheet channel layer 306-3 between the gate structures 604. The anisotropic etch also exposes the gate capping layers 602.

As seen in FIG. 8A, for example, the dielectric layer 800 surrounds the sacrificial nanosheet layer 304-1 in the Y-Z plane and at least partially surrounds the sacrificial nanosheet layer 304-2. As seen in FIG. 8B, for example, portions 800-1 and 800-2 of the dielectric layer 800 have filled in the channels that were exposed by the removal of the sacrificial nanosheet layers 302 and portions 800-3 of the dielectric layer 800 have also formed sidewall spacers for the gate structures 604 while leaving portions of the nanosheet channel layer 306-3 exposed between the gate structures 604.

FIGS. 9A and 9B are cross-sectional views of the semiconductor structure 100 at an intermediate stage of fabrication after etching of the exposed layers of the nanosheet stack structure including portions of sacrificial nanosheet layers 304-2, 304-3 and 304-4 and portions of nanosheet channel layers 306-1, 306-2 and 306-3. FIG. 9A is a schematic side view (Y-Z plane) of the semiconductor structure 100 taken along section line A-A of FIG. 2 and FIG. 9B is a schematic cross-sectional side view (X-Z plane) of the semiconductor structure 100 taken along section line B-B of FIG. 2.

For example, one or more etch processes, e.g., directional RIE processes, may be utilized to etch nanosheet stack structure down to the portion 800-2 of dielectric layer 800 between and around the gate structures 604 removing the exposed portions of semiconductor layers 304-2 through 304-4 and 306-1 through 306-3. As an example, the portion 800-3 of the dielectric layer 800 and the gate capping layers 602 may be used as an etch mask for the removal of the semiconductor layers 304-2 through 304-4 and 306-1 through 306-3 of the nanosheet stack structure during an etching process that is selective to the materials of the dielectric layer 800 and the gate capping layers 602.

FIGS. 10A and 10B are cross-sectional views of the semiconductor structure 100 at an intermediate stage of fabrication after the etching of the exposed portions of the sacrificial nanosheet layers 304-2, 304-3 and 304-4 and formation of inner spacers 1000. FIG. 10A is a schematic side view (Y-Z plane) of the semiconductor structure 100 taken along section line A-A of FIG. 2 and FIG. 10B is a schematic cross-sectional side view (X-Z plane) of the semiconductor structure 100 taken along section line B-B of FIG. 2.

In one embodiment, the inner spacers 1000 are formed by a process which comprises laterally recessing exposed sidewall surfaces of the sacrificial nanosheet layers 304-2, 304-3 and 304-4 of the nanosheet stack structure to form recesses in the sidewalls of the nanosheet stack structure that are not protected by the portion 800-3 of the dielectric layer 800. As shown in FIG. 10B, the exposed sidewall surfaces of the sacrificial nanosheet layers 304-2, 304-3 and 304-4 are laterally recessed to a pre-determined depth, e.g., in the x-direction. The amount of lateral recess is controlled through a timed etch. In one embodiment, the depth of the recess is substantially equal to the thickness of the adjacent portion 800-3 of the dielectric layer 800.

In one illustrative embodiment, the lateral etch process can be performed using an isotropic wet etch process with an etch solution that is suitable to etch the semiconductor material (e.g., SiGe) of the sacrificial nanosheet layers 304-2, 304-3 and 304-4 selective to the semiconductor material (e.g., Si) of the nanosheet channel layers 306, dielectric layer 800 and other exposed elements. In another embodiment, an isotropic dry plasma etch process can be performed to laterally etch the exposed sidewall surfaces of the sacrificial nanosheet layers 304-2, 304-3 and 304-4 selective to the nanosheet channel layers 306, dielectric layer 800 and other exposed elements.

The recesses are then filled with dielectric material to form the inner spacers 1000 (or embedded spacers) on the sidewalls of the nanosheet stack structure. In one embodiment, the inner spacers 1000 are formed by depositing a conformal layer of dielectric material over the semiconductor device structure until the recesses are filled with dielectric material, followed by an etch back to remove the excess dielectric material. In one embodiment, the inner spacers 1000 are formed of the same dielectric material used to form the dielectric layer 800. For example, the inner spacers 1000 can be formed of SiN, SiBCN, SiOCN, SiOC, $SiO_2$ or any other type of dielectric material (e.g., a low-k dielectric material having a k of less than 5) which is commonly used to form insulating gate sidewall spacers of FET devices. In one embodiment, the dielectric material is conformally deposited using a highly conformal deposition process, such as ALD, to ensure that the recesses are sufficiently filled with dielectric material. Other deposition methods such as CVD and PVD can be utilized to deposit a highly conformal layer of dielectric material to fill the recesses. The conformal layer of dielectric material can be etched back using an isotropic wet etch process to remove the excess dielectric material on the sidewalls of the nanosheet stack structure and expose the sidewalls of the nanosheet channel layers 306 while leaving the dielectric material in the recesses to form the inner spacers 1000. The wet etch process may include, but is not limited to, buffered hydrofluoric acid (BHF), diluted hydrofluoric acid (DHF), hydrofluoric nitric acid (HNA), phosphoric acid, HF diluted by ethylene glycol (HF/EG), hydrochloric acid (HCl), or any combination thereof.

Figure 11B:
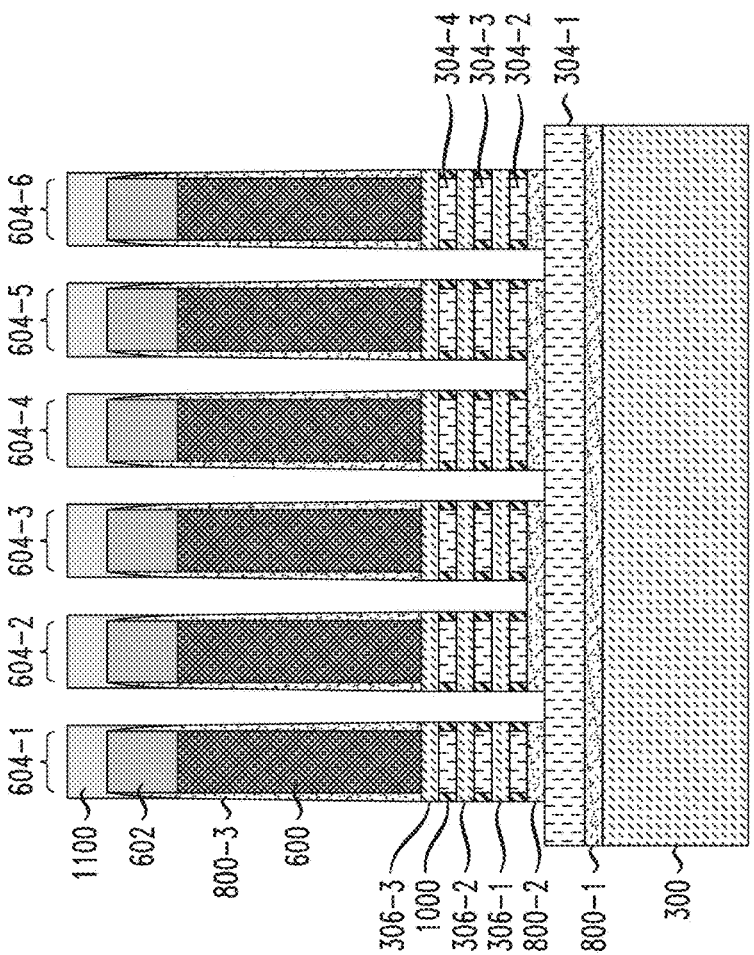
FIGS. 11A and 11B are cross-sectional views of the semiconductor structure of FIGS. 10A and 10B at an intermediate stage of fabrication after forming and patterning an etch mask and etching channels through the dielectric layer 800 according to the etch mask to expose the sacrificial nanosheet layer, according to an embodiment of the invention.
Figure 11A:
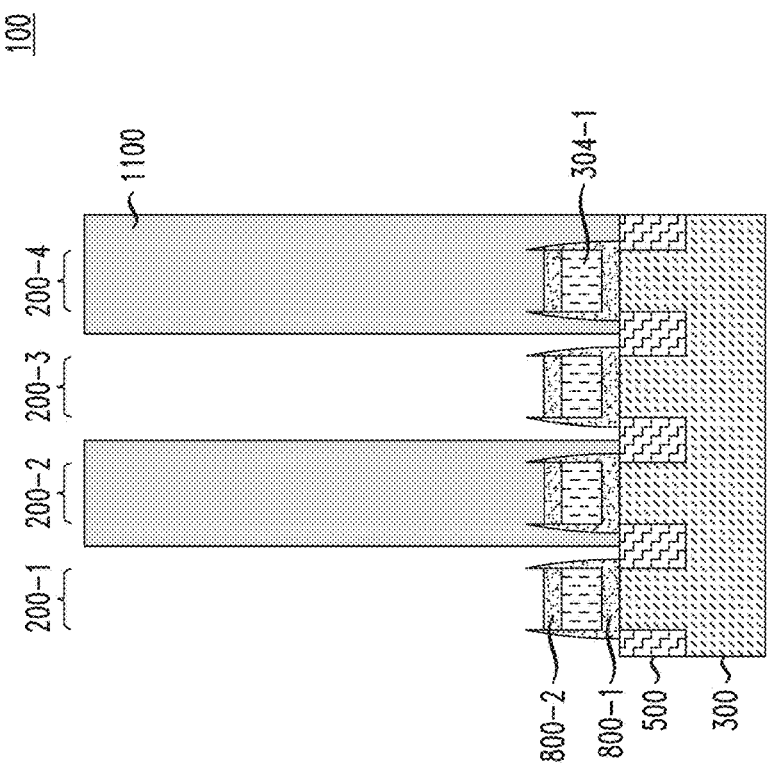

FIGS. 11A and 11B are cross-sectional views of the semiconductor structure 100 at an intermediate stage of fabrication after forming and patterning an etch mask 1100 and etching channels through the portion 800-2 of the dielectric layer 800 according to the etch mask 1100 to expose the sacrificial nanosheet layer 304-1. FIG. 11A is a schematic side view (Y-Z plane) of the semiconductor structure 100 taken along section line A-A of FIG. 2 and FIG. 11B is a schematic cross-sectional side view (X-Z plane) of the semiconductor structure 100 taken along section line B-B of FIG. 2.

As illustrated in FIGS. 11A and 11B, a lithographic process is utilized to form etch mask 1100 over a portion of the semiconductor structure 100 including the gate structures 604. For example, an OPL may be coated on the semiconductor structure 100, followed by a lithographic process to pattern the OPL and form the etch mask 1100. The OPL may comprise, for example, a resin material that is applied by spin coating and baked to enhance planarization. The patterned portion of the OPL is removed such that etch mask 1100 exposes the portion 800-2 of the dielectric layer 800 in the regions adjacent to gate structure 604-1, between gate structures 604-3 and 604-4 and adjacent to gate structure 604-6. For example, the etch mask 1100 may expose the region between every other pair of gate structures 604 and in some embodiments, on either side of the gate structures 604 that will become the SDBs, e.g., gate structures 604-1 and 604-6 in the embodiment shown in FIG. 11B. As shown in FIG. 11A, the etch mask patterning may also expose the portion 800-2 of the dielectric layer 800 for semiconductor devices 200-1 and 200-3 while covering the portion 800-2 of the dielectric layer 800 for semiconductor devices 200-2 and 200-4. A directional etch process, e.g., a directional RIE process, is utilized to etch exposed portion 800-2 of the dielectric layer 800 down to the sacrificial nanosheet layer 304-1 according to the pattern of the etch mask 1100. For example, the etch chemistry may be selective to the material of the gate capping layers 602, the sacrificial nanosheet layer 304-1 and the etch mask 1100. The etch mask 1100 may then be removed, for example, using a plasma etch process or ash process.

Figure 12B:
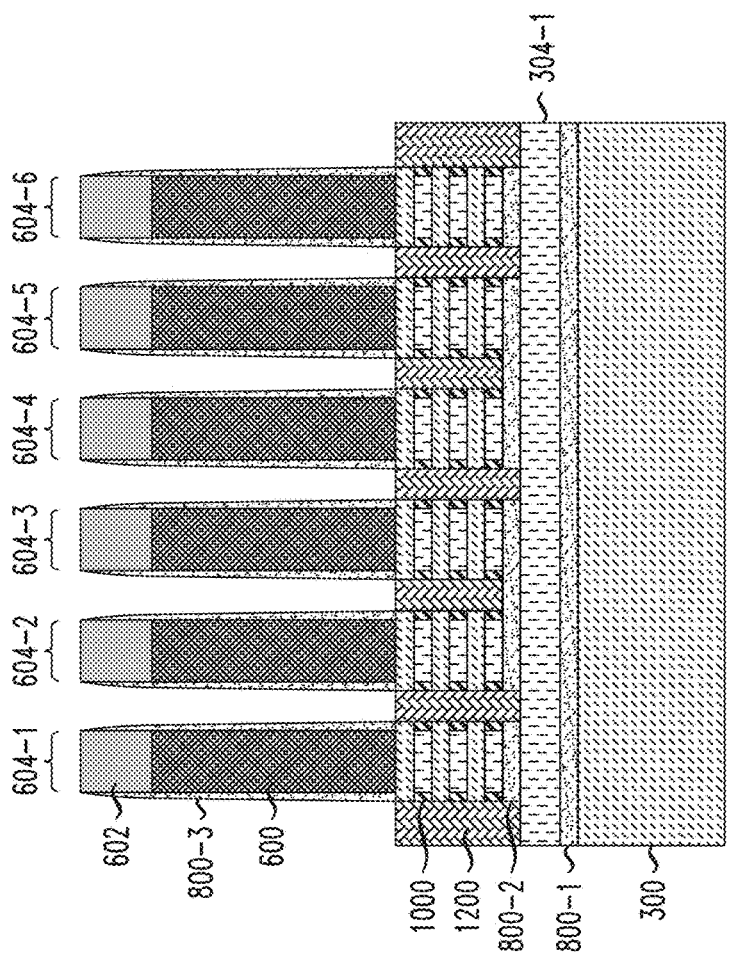
FIGS. 12A and 12B are cross-sectional views of the semiconductor structure of FIGS. 11A and 11B at an intermediate stage of fabrication after the formation of source/drain regions on the exposed portions of the sacrificial nanosheet layer and the exposed portions of the dielectric layer, according to an embodiment of the invention.
Figure 12A:
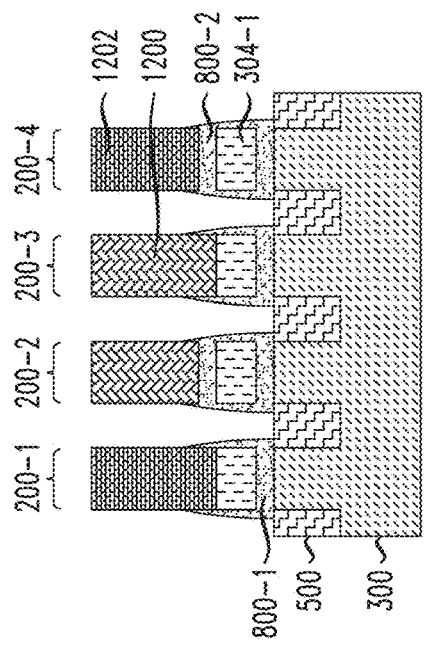

FIGS. 12A and 12B are cross-sectional views of the semiconductor structure 100 at an intermediate stage of fabrication after the formation of source/drain regions 1200 and 1202 on the exposed portions of the sacrificial nanosheet layer 304-1 and the exposed portions of portion 800-2 of dielectric layer 800. FIG. 12A is a schematic side view (Y-Z plane) of the semiconductor structure 100 taken along section line A-A of FIG. 2 and FIG. 12B is a schematic cross-sectional side view (X-Z plane) of the semiconductor structure 100 taken along section line B-B of FIG. 2.

The source/drain regions 1200 and 1202 may be formed, for example, by implantation of suitable dopants, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). The source/drain regions 1200 and 1202 may also be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor. The dopant concentration can range from $1\times10^{19}$ $cm^{-3}$ to $3\times10^{21}$ $cm^{-3}$, or preferably between $2\times10^{20}$ $cm^{-3}$ to $3\times10^{21}$ $cm^{-3}$.

In some embodiments, the source/drain regions 1200 and 1202 may be formed or grown on the sacrificial nanosheet layer 304-1 and on the portion 800-2 of the dielectric layer 800 adjacent to the nanosheet stack structures and up to the portion 800-3 of the dielectric layer 800 above the nanosheet channel layer 306-3 such that the nanosheet channel layer 306-3 is no longer exposed. In some embodiments, the source/drain regions 1200 and 1202 may be formed or grown above the nanosheet channel layer 306-3 and then recessed or patterned back to the desired height relative to the nanosheet channel layer 306-3 in the z-direction. It is important to note that FIG. 12B shows the cross-section B-B of FIG. 2 which is along either a nFET or pFET semiconductor device 200. Accordingly, the source/drain regions 1200 and 1202 in FIG. 12B comprise the same material or dopant, etc., e.g., n-type material or p-type material but not both. In contrast, FIG. 12A illustrates cross-section A-A of FIG. 2 which is across multiple semiconductor devices 200 of different types. In this case, both n-type material and p-type material are illustrated. For example, in a case where source/drain regions 1200 comprise n-type materials or dopants, source/drain regions 1202 will comprise p-type materials or vice versa.

Figure 13B:
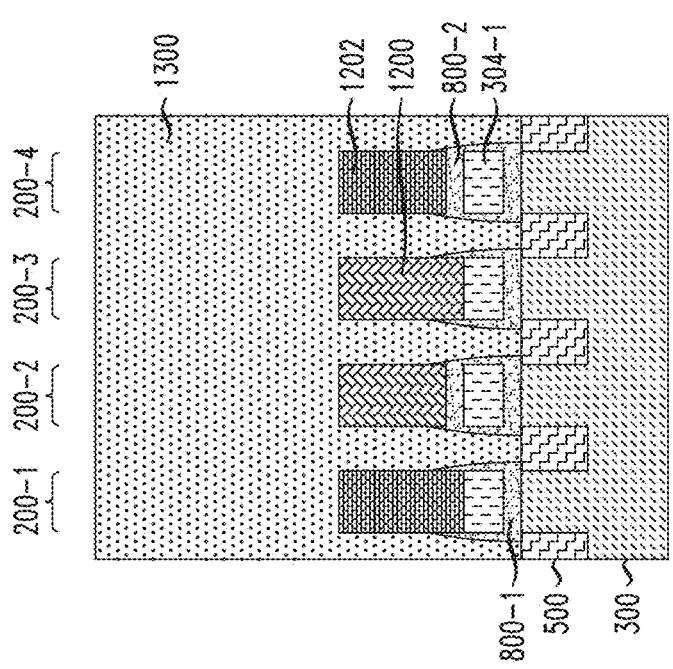
FIGS. 13A and 13B are cross-sectional views of the semiconductor structure of FIGS. 12A and 12B at an intermediate stage of fabrication after the formation of an interlayer dielectric, according to an embodiment of the invention.
Figure 13A:

FIGS. 13A and 13B are cross-sectional views of the semiconductor structure 100 at an intermediate stage of fabrication after the formation of an inter-layer dielectric (ILD) 1300. FIG. 13A is a schematic side view (Y-Z plane) of the semiconductor structure 100 taken along section line A-A of FIG. 2 and FIG. 13B is a schematic cross-sectional side view (X-Z plane) of the semiconductor structure 100 taken along section line B-B of FIG. 2.

For example, a dielectric material, including, but not limited to $SiO_x$, low temperature oxide (LTO), high temperature oxide (HTO), flowable oxide (FOX) or some other dielectric, is deposited to form an ILD 1300 on the gate structures 604 and source/drain regions 1200 and 1202. The ILD 1300 can be deposited using deposition techniques including, but not limited to, CVD, PECVD, RFCVD, PVD, ALD, MLD, MBD, PLD, and/or LSMCD, sputtering, and/or plating. Planarization, for example, chemical mechanical polishing (CMP) can be performed to remove excess material from ILD 1300 and planarize the resulting structure. The planarization can be performed down to the dummy gate electrodes 600 of the gate structures 604 such that the gate capping layers 602 are removed and the dummy gate electrodes 600 are exposed. In accordance with an exemplary embodiment, the ILD 1300 electrically isolates the different gate structures 604 from each other.

FIGS. 14A and 14B are cross-sectional views of the semiconductor structure 100 at an intermediate stage of fabrication after the formation of a sacrificial cap 1400 and etch mask 1402 over the gate structures 604-1 and 604-6 that correspond to the SDBs. FIG. 14A is a schematic side view (Y-Z plane) of the semiconductor structure 100 taken along section line A-A of FIG. 2 and FIG. 14B is a schematic cross-sectional side view (X-Z plane) of the semiconductor structure 100 taken along section line B-B of FIG. 2.

A hard mask is formed on the planarized surface of the ILD 1300, portion 800-3 of the dielectric layer 800 and dummy gate electrodes 600 by depositing a layer of dielectric material such as silicon nitride (SiN), silicon carbon nitride (SiCN), silicon oxynitride (SiON), boron nitride (BN), silicon boron nitride (SiBN), siliconborocarbonitride (SiBCN), silicon oxycarbonitride (SiOCN), or other similar materials commonly used to form sacrificial capping layers.

The hard mask is then patterned to form sacrificial cap 1400 over the gate structures 604-1 and 604-6. For example, a lithographic process is utilized to form an etch mask 1402 over a portion of the semiconductor structure 100 including the gate structures 604-1 and 604-6. For example, an OPL may be coated on the semiconductor structure 100, followed by a lithographic process to pattern the OPL and form the etch mask 1402. The OPL may comprise, for example, a resin material that is applied by spin coating and baked to enhance planarization. The patterned portion of the OPL is removed such that etch mask 1402 exposes the hard mask over dummy gate electrodes 600 of gate structures 604-2 through 604-5 while the hard mask over gate structures 604-1 and 604-6 remain by the etch mask 1402. A directional etch process, e.g., a directional RIE process, is utilized to etch exposed hard mask down to the dummy gate structures 604-2 through 604-5 according to the pattern of the etch mask 1402, forming sacrificial caps 1400 over gate structures 604-1 and 604-6. For example, the etch chemistry may be selective to the material of the ILD 1300, dummy gate electrodes 600 and dielectric layer 800.

FIGS. 15A and 15B are cross-sectional views of the semiconductor structure 100 at an intermediate stage of fabrication after the removal of the dummy gate electrodes 600 and the sacrificial nanosheet layers 304-2, 304-3 and 304-4 of the gate structures 604-2 through 604-5. FIG. 15A is a schematic side view (Y-Z plane) of the semiconductor structure 100 taken along section line A-A of FIG. 2 and FIG. 15B is a schematic cross-sectional side view (X-Z plane) of the semiconductor structure 100 taken along section line B-B of FIG. 2.

The dummy gate electrodes 600 are etched away using known etching techniques and etch chemistries. For example, the dummy gate material can be removed using a selective dry etch or wet etch process with suitable etch chemistries, including ammonium hydroxide (NH$_4$OH), tetramethylammonium hydroxide (TMAH), or SF6 plasma. The etching of the dummy gate electrodes 600 is selective to, e.g., the ILD 1300, dielectric layer 800 and sacrificial nanosheet layers 304 and nanosheet channel layers 306, to thereby protect the semiconductor materials of the nanosheet stack structure from being etched during the poly etch process. The etching of the dummy gate electrodes 600 open gate structures 604-2 through 604-5.

Sacrificial nanosheet layers 304-2, 304-3 and 304-4 are selectively etched away to release the nanosheet channel layers 306, thereby allowing the opened gate structures 604-2 through 604-5 to extend into spaces between and adjacent to the nanosheet channel layers 306. In this embodiment, the opened gate structures 604-2 through 604-5 include the open spaces within the inner region defined by the portions 800-3 of the dielectric layer 800 and the inner spacers 1000.

The sacrificial nanosheet layers 304-2, 304-3 and 304-4, e.g., SiGe layers, can be etched away selective to the nanosheet channel layers 306, e.g., Si layers, using a wet etch process, for example. In one embodiment, the SiGe material of the sacrificial nanosheet layers 304-2, 304-3 and 304-4 can be selectively etched (with high etch selectivity) using a gas phase HCl (hydrochloric acid) or wet etch solution to laterally etch the SiGe material of the sacrificial nanosheet layers 304-2, 304-3 and 304-4 selective to the Si material of the nanosheet channel layers 306. The gas phase HCl (hydrochloric acid) provides high etch selectivity when, for example, the nanosheet channel layers 306 are formed of Si or SiGe with a lower Ge concentration than the SiGe material of the sacrificial nanosheet layers 304-2, 304-3 and 304-4. As can be seen in FIG. 15B, sacrificial nanosheet layer 304-1 is not etched away at this time because it is protected by portion 800-2 of dielectric layer 800.

In some embodiments, etching of the dummy gate electrodes 600 or the sacrificial nanosheet layers 304 may also remove the etch mask 1402. In other embodiments, etch mask 1402 may be removed using a separate process such as, for example, a plasma etch process or an ash process. In some embodiments, the etch mask 1402 is removed prior to the etching of the dummy gate electrodes 600.

Figure 16A:
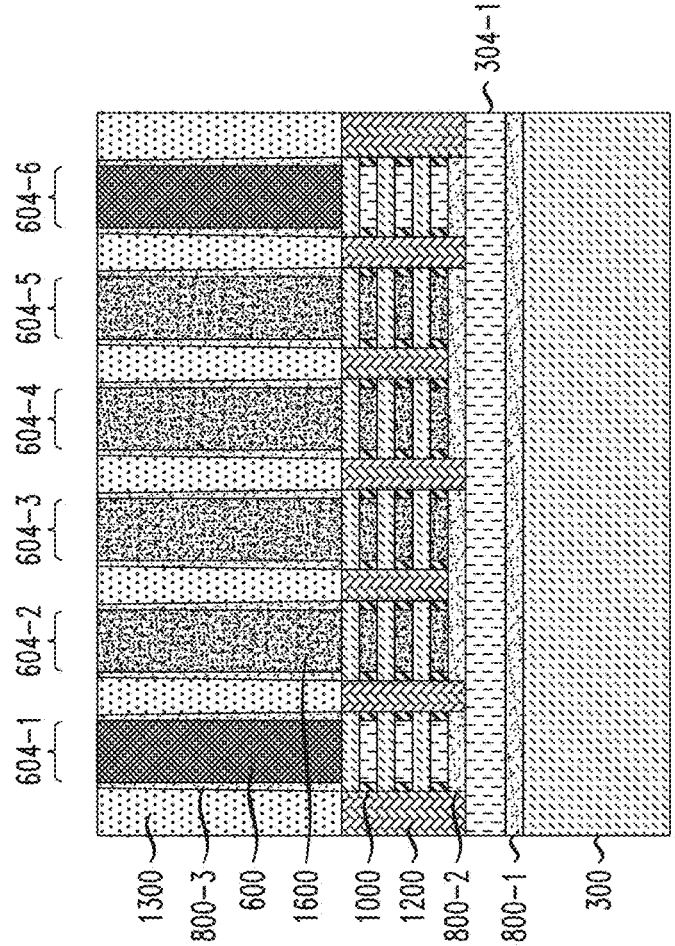
FIGS. 16A and 16B are cross-sectional views of the semiconductor structure of FIGS. 15A and 15B at an intermediate stage of fabrication after the formation of gate conductor layers in the gate structures and the removal of the sacrificial caps, according to an embodiment of the invention.
Figure 16B:
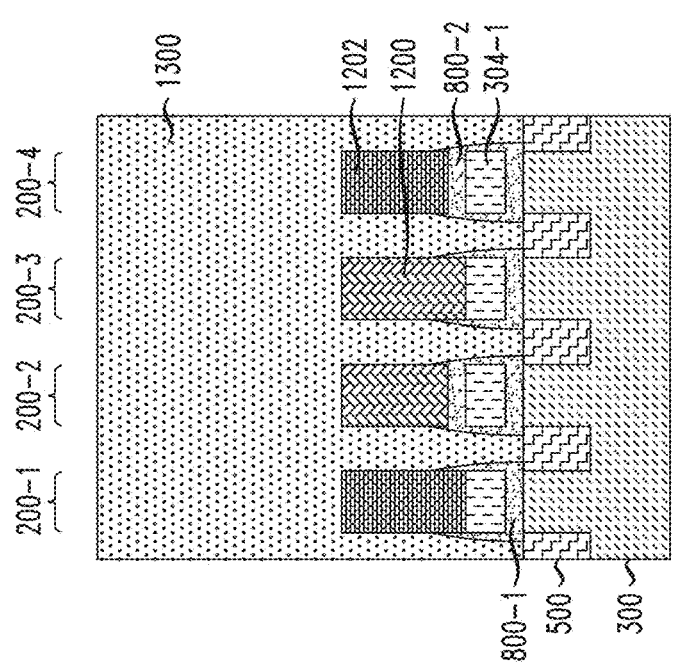

FIGS. 16A and 16B are cross-sectional views of the semiconductor structure 100 at an intermediate stage of fabrication after the formation of gate conductor layers 1600 in the gate structures 604-2 through 604-5 and the removal of the sacrificial caps 1400. FIG. 16A is a schematic side view (Y-Z plane) of the semiconductor structure 100 taken along section line A-A of FIG. 2 and FIG. 16B is a schematic cross-sectional side view (X-Z plane) of the semiconductor structure 100 taken along section line B-B of FIG. 2.

In some embodiments, an optional gate dielectric layer (not shown) is formed prior to the formation of the gate conductor layers 1600. The gate dielectric layer comprises, for example, a high-K dielectric layer including, but not necessarily limited to, HfO2 (hafnium oxide), ZrO2 (zirconium dioxide), hafnium zirconium oxide, Al$_2$O$_3$ (aluminum oxide), and Ta2O5 (tantalum pentoxide) or other electronic grade (EG) oxide. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. In one embodiment, the dielectric material for the gate dielectric layer is conformally deposited using a highly conformal deposition process, such as ALD. Other deposition methods such as CVD and PVD can be utilized to deposit a highly conformal layer of dielectric material to cover exposed portions of the gate structures 604.

The gate conductor layers 1600 may include a metal gate or work function metal (WFM). In an illustrative embodiment, gate conductor layers 1600 comprise a WFM for either an nFET device or a pFET device. For nFET devices, the WFM for the gate conductor may comprise titanium (Ti), aluminum (Al), titanium aluminum (TiAl), titanium aluminum carbon (TiAlC), a combination of Ti and Al alloys, a stack which includes a barrier layer (e.g., of titanium nitride (TiN) or another suitable material) followed by one or more of the aforementioned WFM materials, etc. For pFET devices, the WFM for the gate conductor may comprise TiN, tantalum nitride (TaN), or another suitable material. In some embodiments, the pFET WFM may include a metal stack, where a thicker barrier layer (e.g., of TiN, TaN, etc.) is formed followed by a WFM such as Ti, Al, TiAl, TiAlC, or any combination of Ti and Al alloys. It should be appreciated that various other materials may be used for the gate conductor layers 1600 as desired.

The gate conductor layers 1600 are formed using, for example, deposition techniques including, but not limited to, CVD, PECVD, RFCVD, PVD, ALD, MLD, MBD, PLD, LSMCD, sputtering, and/or plating. In an illustrative embodiment, gate conductor layers 1600 are deposited on the semiconductor device structure including on ILD layer 1300, on and in between the nanosheet channel layers 306 of the nanosheet stack structure and within the gate structures 604-2 through 604-5, for example, as seen in FIG. 16B. Excess WFM material may be removed using, for example, etching or CMP processes. In some embodiments, the etching or CMP processes may also remove the sacrificial caps 1400 to expose the dummy gate electrodes 600 of the gate structures 604-1 and 604-6.

Figure 17A:
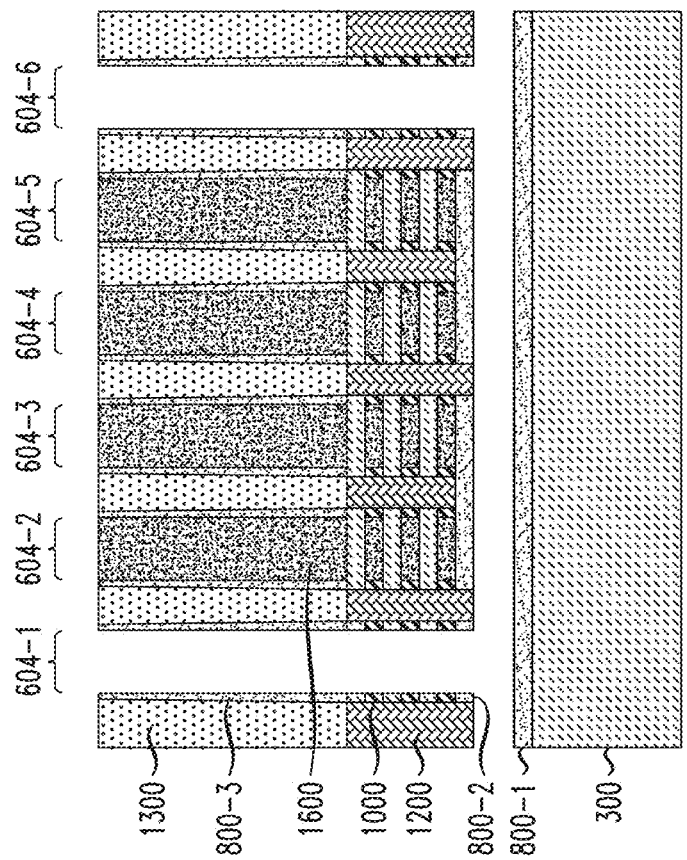
FIGS. 17A and 17B are cross-sectional views of the semiconductor structure of FIGS. 16A and 16B at an intermediate stage of fabrication after the opening of the gate structures down to the sacrificial nanosheet layer and the removal of the sacrificial nanosheet layer, according to an embodiment of the invention.
Figure 17B:
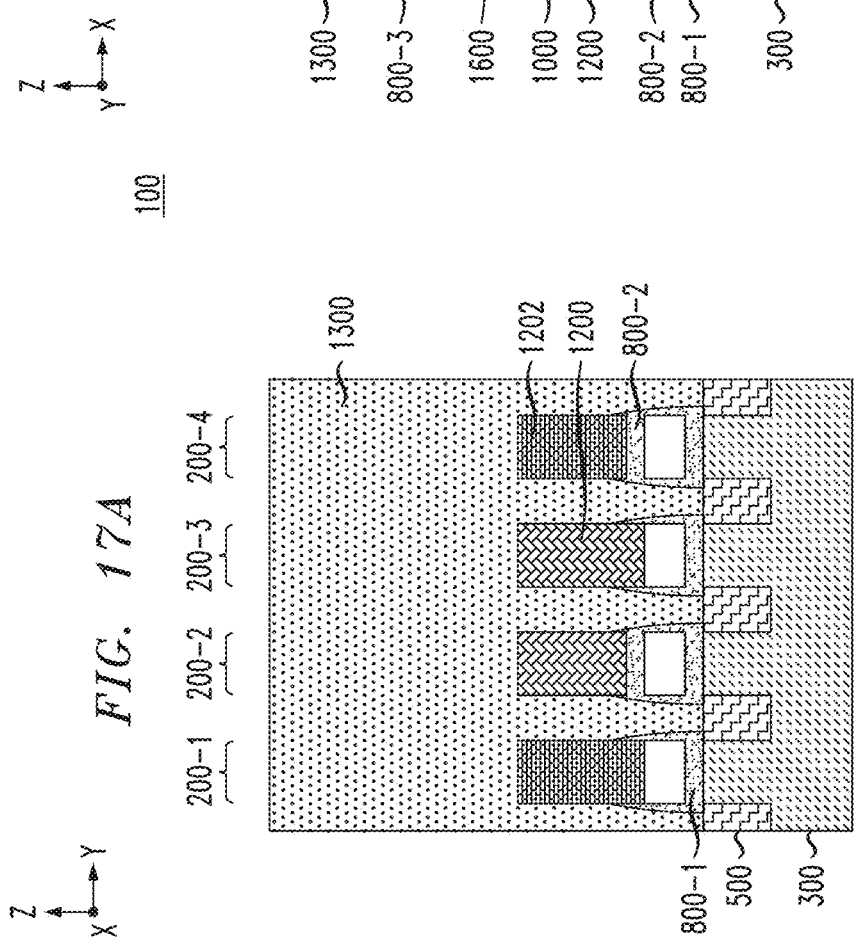

FIGS. 17A and 17B are cross-sectional views of the semiconductor structure 100 at an intermediate stage of fabrication after the opening of the gate structures 604-1 and 604-6 down to the sacrificial nanosheet layer 304-1 and the removal of the sacrificial nanosheet layer 304-1. FIG. 17A is a schematic side view (Y-Z plane) of the semiconductor structure 100 taken along section line A-A of FIG. 2 and FIG. 17B is a schematic cross-sectional side view (X-Z plane) of the semiconductor structure 100 taken along section line B-B of FIG. 2.

Gate structures 604-1 and 604-6 are opened using one or more etch processes to remove the dummy gate electrodes 600, sacrificial layers 304-2, 304-3 and 304-4, nanosheet channel layers 306 and portion 800-2 of dielectric layer 800 to expose the sacrificial nanosheet layer 304-1 under the gate structures 604-1 and 604-6. For example, a directional anisotropic RIE process may be utilized that is selective to the [STI] ILD layer 1300 and gate conductor layers 1600. The anisotropic RIE is configured to etch away all of the layers in the gate structures 604-1 and 604-6 including the dummy gate electrodes 600, sacrificial layers 304-2, 304-3 and 304-4, nanosheet channel layers 306 and portion 800-2 of dielectric layer 800 to expose the sacrificial nanosheet layer 304-1 in a single process. In some embodiments the anisotropic RIE may also etch at least partially into the sacrificial nanosheet layer 304-1. The SiGe material of the sacrificial nanosheet layer 304-1 can then be selectively etched (with high etch selectivity) using a gas phase HCl (hydrochloric acid) or wet etch solution to laterally etch the SiGe material of the sacrificial nanosheet layer 304-1 selective to dielectric layer 800 and inner spacers 1000. In other embodiments, the dummy gate electrodes 600, sacrificial layers 304-2, 304-3 and 304-4, nanosheet channel layers 306 and portion 800-2 of dielectric layer 800 may be etched away in multiple etch processes.

Figure 18B:
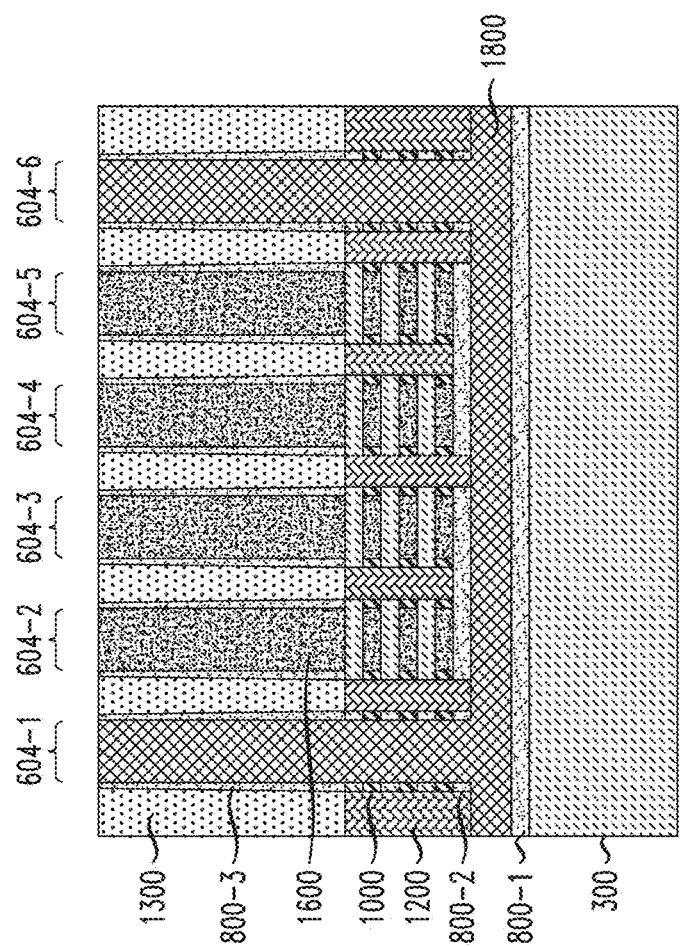
FIGS. 18A and 18B are cross-sectional views of the semiconductor structure of FIGS. 17A and 17B at an intermediate stage of fabrication after the formation of the BPR in the opened gate structures and in the channel exposed by the removal of the sacrificial nanosheet layer, according to an embodiment of the invention.
Figure 18A:
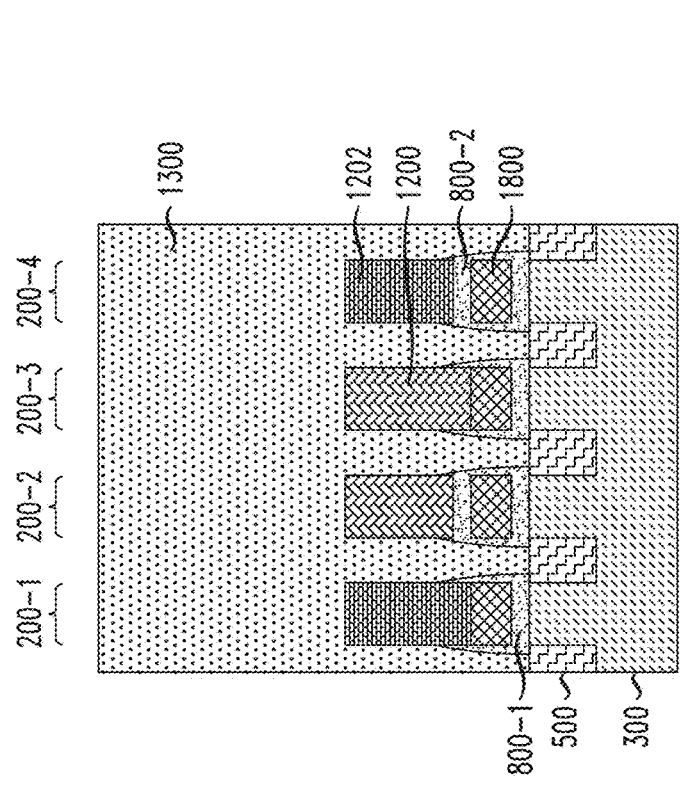

FIGS. 18A and 18B are cross-sectional views of the semiconductor structure 100 at an intermediate stage of fabrication after the formation of the BPR 1800 in the opened gate structures 604-1 and 604-6 and in the channel exposed by the removal of the sacrificial nanosheet layer 304-1. FIG. 18A is a schematic side view (Y-Z plane) of the semiconductor structure 100 taken along section line A-A of FIG. 2 and FIG. 18B is a schematic cross-sectional side view (X-Z plane) of the semiconductor structure 100 taken along section line B-B of FIG. 2.

BPR 1800 may be comprise a metal-based material such as, e.g., tungsten, cobalt, zirconium, tantalum, titanium, aluminum, ruthenium, and/or copper. BPR 1800 may be formed by conformal deposition using, for example, deposition techniques including, but not limited to, CVD, PECVD, RFCVD, PVD, ALD, MLD, MBD, PLD, LSMCD, sputtering, and/or plating. In some embodiments, metal-based material of the BPR 1800 is deposited to fill the channel exposed by the removal of the sacrificial nanosheet channel layer 304-1 and to fill the opened gate structures 604-1 and 604-6. A CMP may be utilized to planarize the semiconductor structure 100 and etch away any unwanted metal-based material.

FIGS. 19A and 19B are cross-sectional views of the semiconductor structure 100 at an intermediate stage of fabrication after the gate conductor layers 1600 and BPR 1800 are recessed in the gate structures 604-1 through 604-6. FIG. 19A is a schematic side view (Y-Z plane) of the semiconductor structure 100 taken along section line A-A of FIG. 2 and FIG. 19B is a schematic cross-sectional side view (X-Z plane) of the semiconductor structure 100 taken along section line B-B of FIG. 2.

Gate conductor layers 1600 and BPR 1800 may be recessed using one or more etch processes. For example, where the metal-based materials of gate conductor layers 1600 and BPR 1800 are different, two different etch processes may be utilized. As an example, a first isotropic wet etch process may be used to recess the gate conductor layers 1600 that is selective to the material of BPR 1800 and a second isotropic wet etch process may be used to recess the BPR 1800 that is selective to the material of the gate conductor layers 1600.

Figure 21:
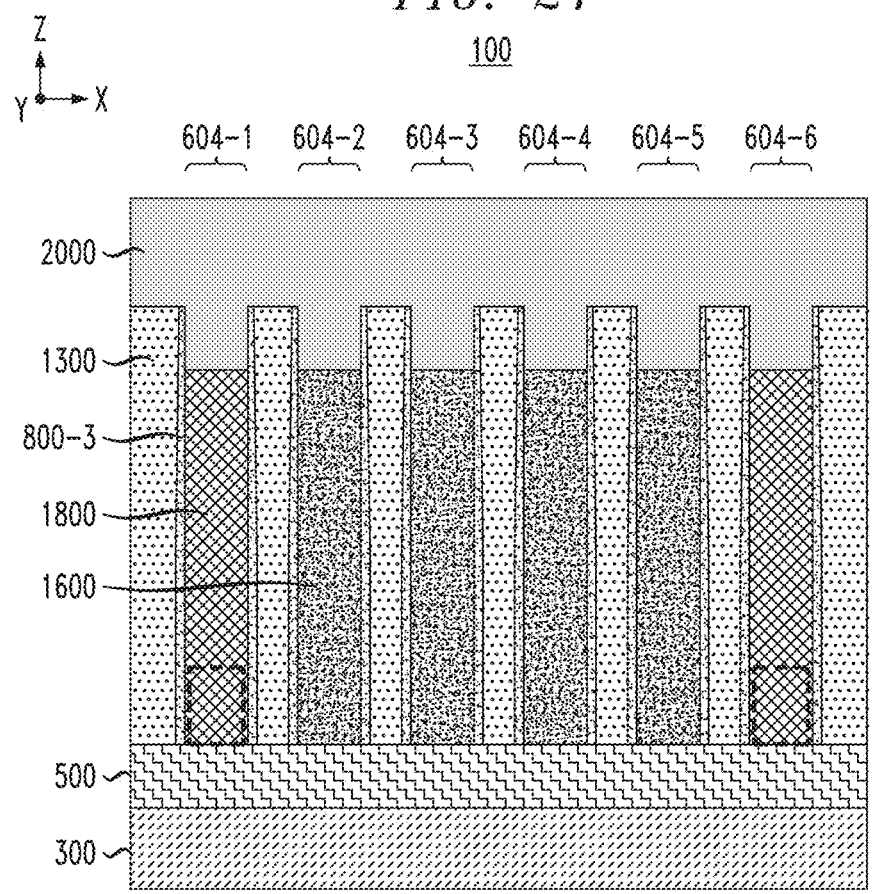
Figure 22:
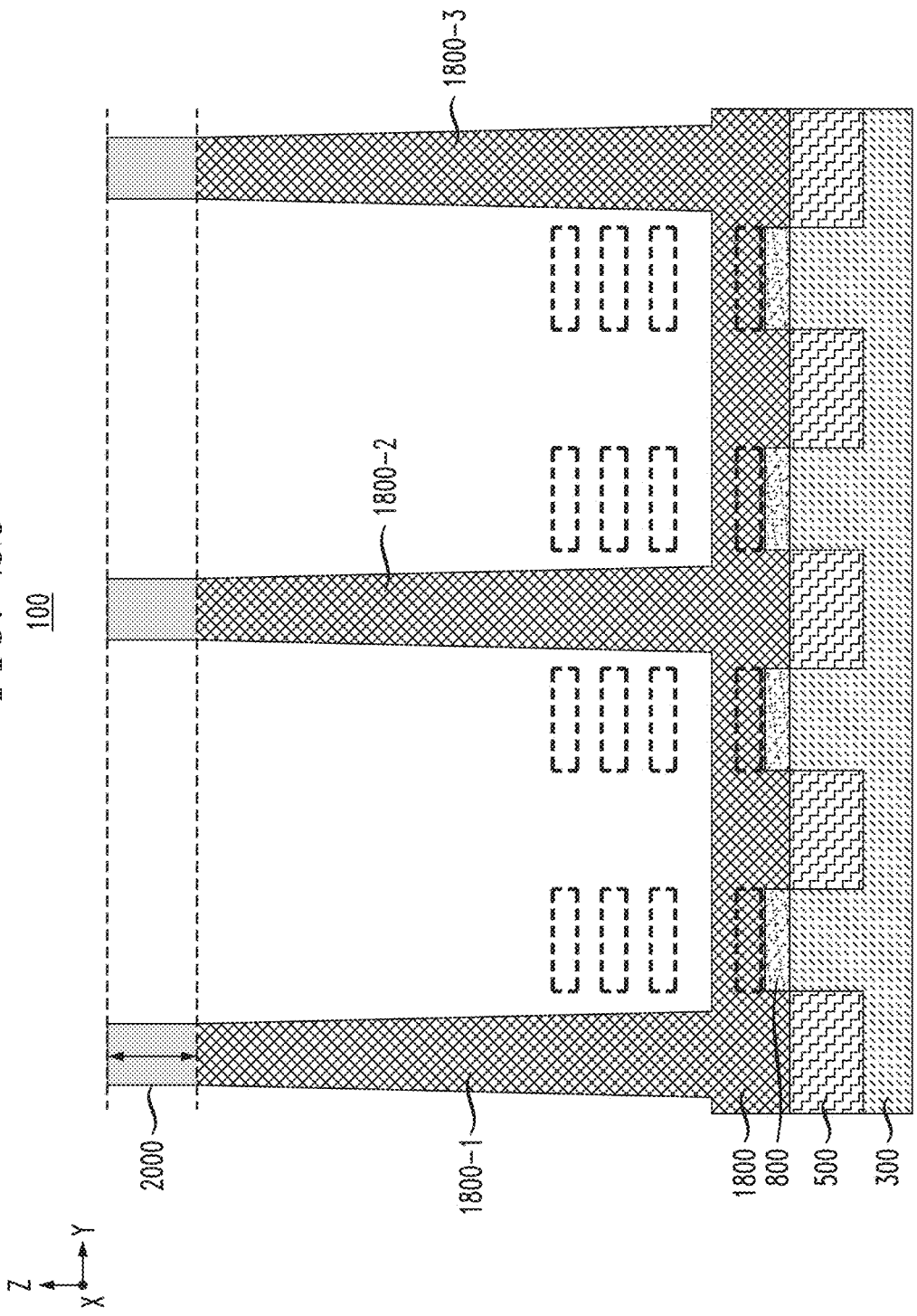

FIGS. 20A, 20B, 21 and 22 are cross-sectional views of the semiconductor structure 100 at an intermediate stage of fabrication after an etch mask 2000 is formed that exposes gate structures 604-1 and 604-6 and BPR 1800 is etched down to the level of the portion 800-2 of the dielectric layer 800 to open the gate structures 604-1 and 604-6. FIG. 20A is a schematic side view (Y-Z plane) of the semiconductor structure 100 taken along section line A-A of FIG. 2, FIG. 20B is a schematic cross-sectional side view (X-Z plane) of the semiconductor structure 100 taken along section line B-B of FIG. 2, FIG. 21 is a schematic cross-sectional side view (X-Z plane) of the semiconductor structure 100 taken along section line C-C of FIG. 2 and FIG. 22 is a schematic side view (Y-Z plane) of the semiconductor structure 100 taken along section line D-D of FIG. 2.

Etch mask 2000 may be formed and patterned in the manner described above for etch mask 1402 to expose the BPR 1800 and portions of ILD 1300 and dielectric layer 800 adjacent to gate structures 604-1 and 604-6.

The BPR 1800 may be etched down to the level of the portion 800-2 of the dielectric layer 800, in the z-direction, using, for example, a timed anisotropic etch although other etching processes may alternatively be utilized. The etch is configured to leave a portion of the BPR 1800 in each of the gate structures 604-1 and 604-6 and not overetch into the BPR 1800 disposed between the portions 800-1 and 800-2 of the dielectric layer 800.

As can be seen in FIG. 21, the material of BPR 1800 in the gate structures 604-1 and 604-6 is not etched back at the C-C cross section because it will be used as a contact for upper-level electrical connections to the BPR 1800. As seen in FIG. 22, for example, the BPR 1800 forms contact pillars 1800-1, 1800-2 and 1800-3 with etch mask 2000 on top separated by recessed valleys that correspond to the SDB gate structure 604-1 for each semiconductor device 200. As seen in FIG. 22, nanosheet channel layers are illustrated with black dashed lines to show that they have been etched away in the D-D cross section but extend through the semiconductor devices 200 in those locations, e.g., in the x-direction. Similarly, the white dashed lines shown in FIG. 21 indicate the locations where the BPR 1800 extends through the SDBs, e.g., in the y-direction, and the white dashed lines shown in FIG. 22 indicate the locations where the BPR 1800 extends through the semiconductor devices 200, e.g., in the X-direction.

Figure 23A:
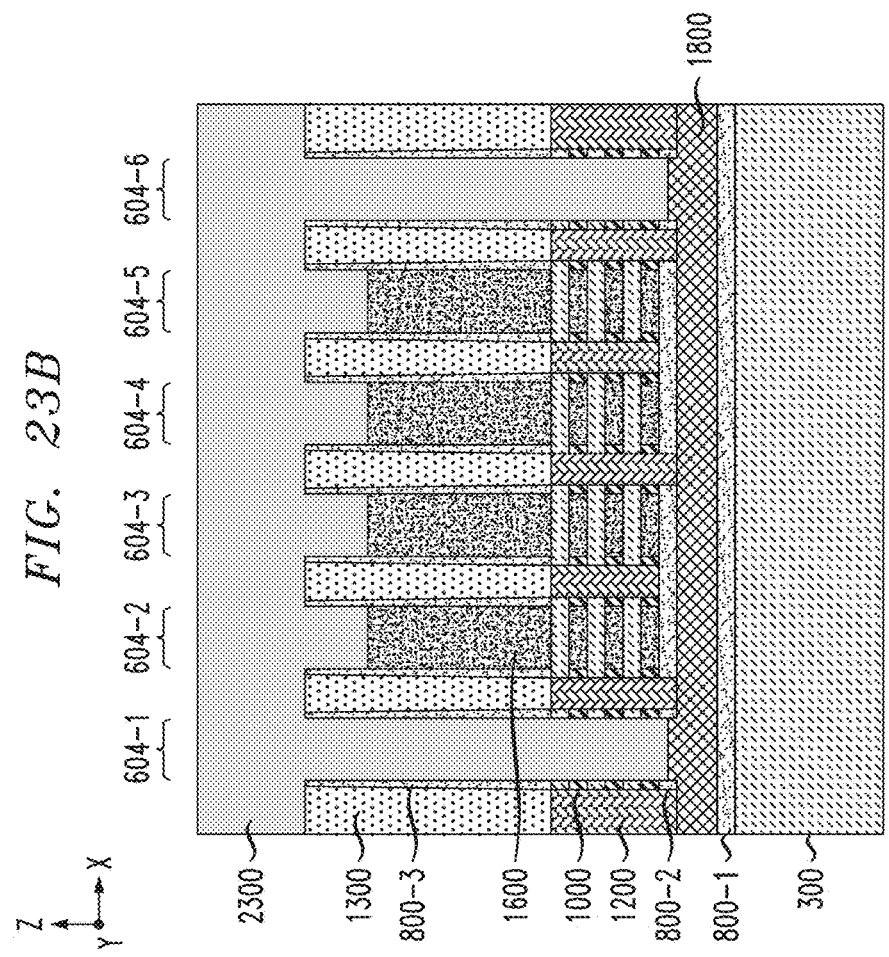
Figure 23B:
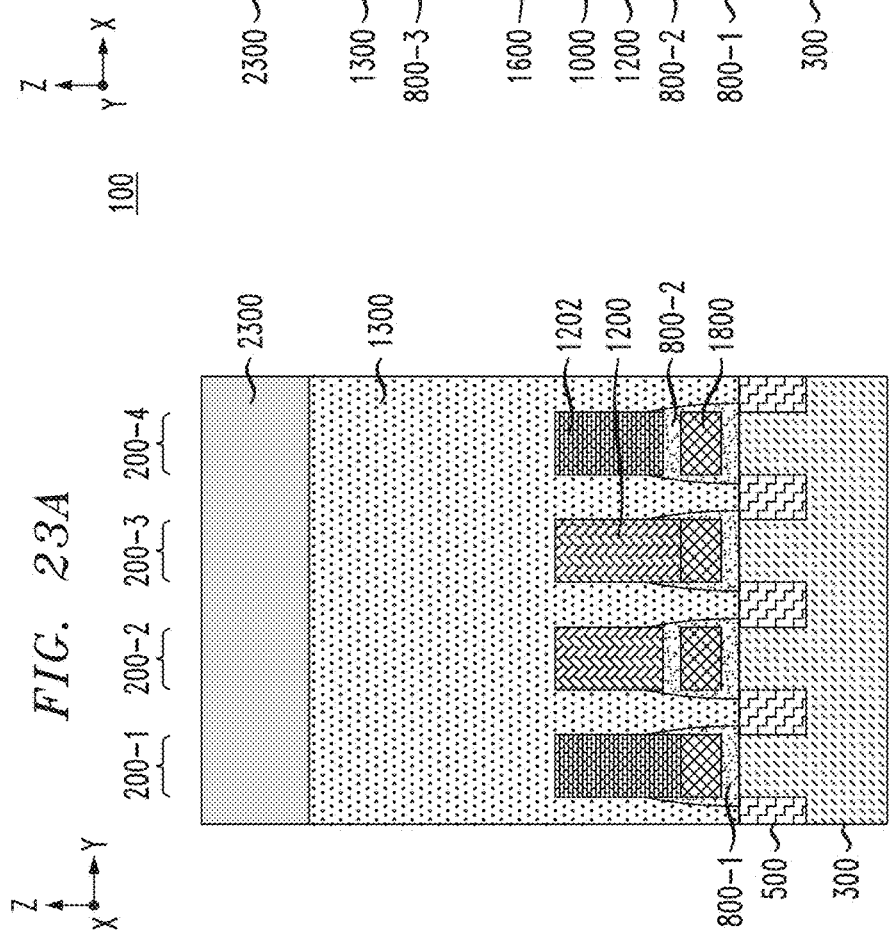
Figure 25:
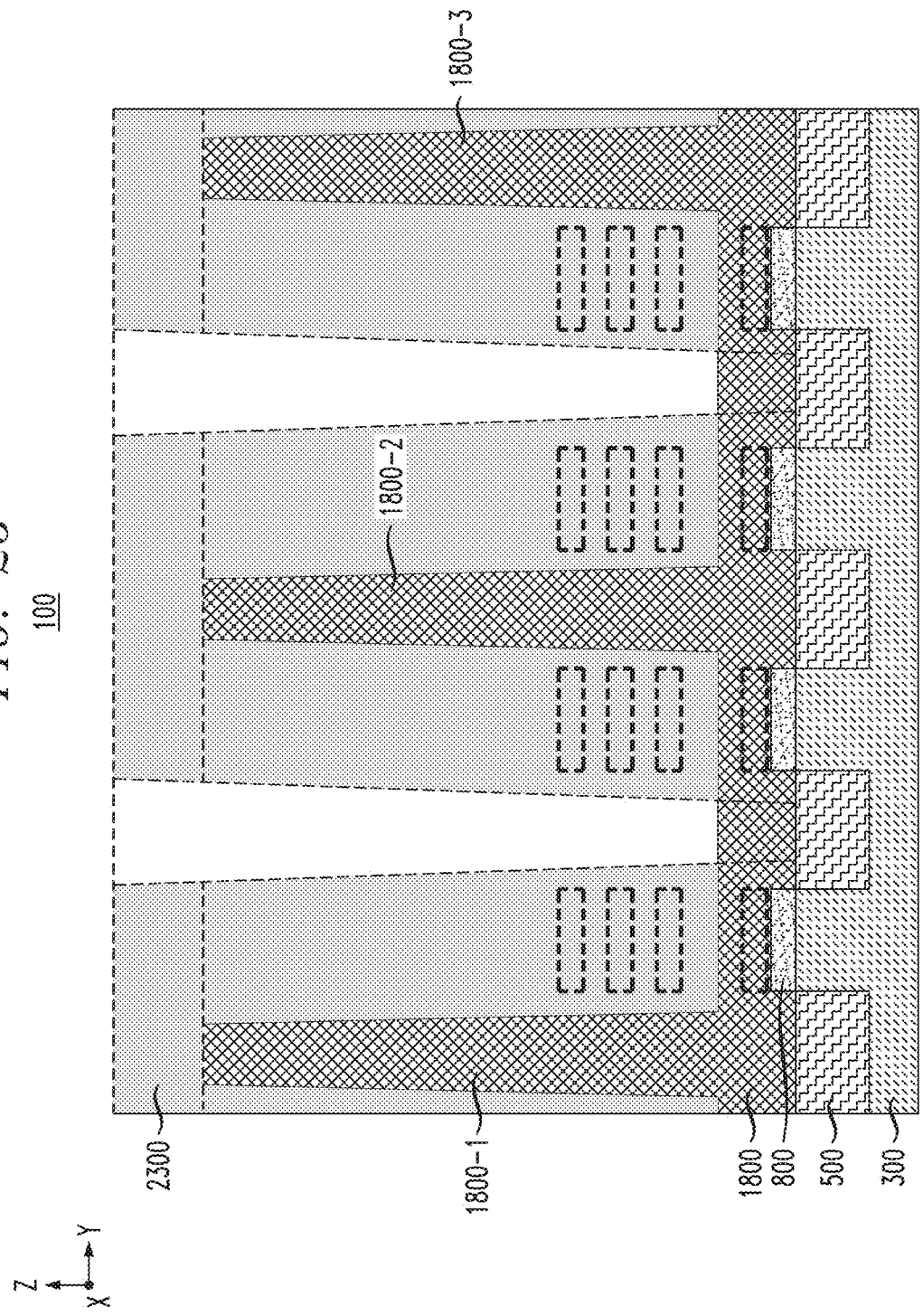

FIGS. 23A, 23B, 24 and 25 are cross-sectional views of the semiconductor structure 100 at an intermediate stage of fabrication after forming an etch mask 2300 and performing a gate cut to separate the BPR 1800 between the n-type and p-type semiconductor devices 200. FIG. 23A is a schematic side view (Y-Z plane) of the semiconductor structure 100 taken along section line A-A of FIG. 2, FIG. 23B is a schematic cross-sectional side view (X-Z plane) of the semiconductor structure 100 taken along section line B-B of FIG. 2, FIG. 24 is a schematic cross-sectional side view (X-Z plane) of the semiconductor structure 100 taken along section line C-C of FIG. 2 and FIG. 25 is a schematic side view (Y-Z plane) of the semiconductor structure 100 taken along section line D-D of FIG. 2.

In some embodiments, etch mask 2000 may be removed, for example, using a plasma etch process or ash process and a new etch mask 2300 may be formed and patterned, for example, using the techniques described above, to expose the BPR 1800 over the portions of the STI layer 500 disposed between the pillars 1800-1, 1800-2 and 1800-3 of BPR 1800. The exposed portions of the BPR 1800 are then etched down to the STI layer 500, e.g., using RIE selective to the etch mask 2300 and STI layer 500 to cut the connections between pillars 1800-1, 1800-2 and 1800-3 of the BPR 1800. Each pillar 1800-1, 1800-2 and 1800-3 now has its own BPR 1800 after the cut, as shown, for example, in FIG. 25.

Figure 27:
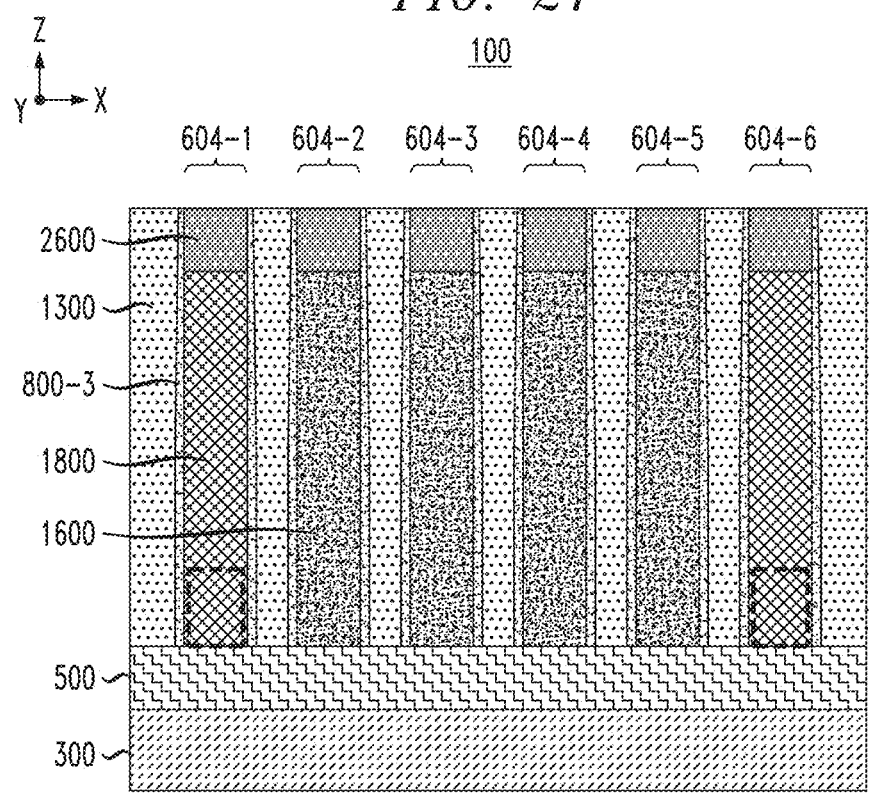
Figure 28:
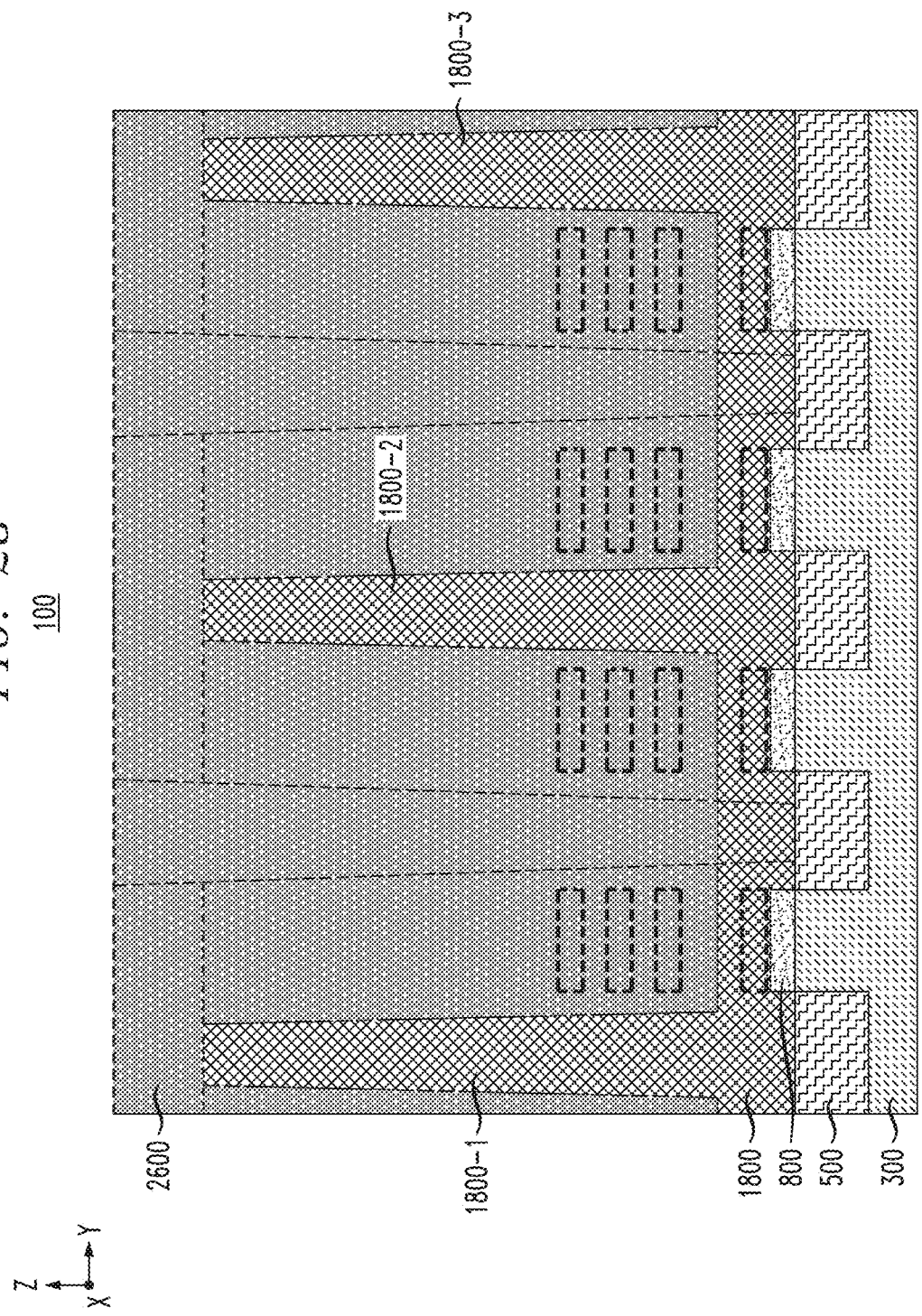

FIGS. 26A, 26B, 27 and 28 are cross-sectional views of the semiconductor structure 100 at an intermediate stage of fabrication after removal of the etch mask 2300 and formation of ILD layer 2600 in the exposed portions of gate structures 604-1 through 604-6 and between pillars 1800-1, 1800-2 and 1800-3 of the BPR 1800 to electrically isolate the pillars 1800-1, 1800-2 and 1800-3 from each other. FIG. 26A is a schematic side view (Y-Z plane) of the semiconductor structure 100 taken along section line A-A of FIG. 2, FIG. 26B is a schematic cross-sectional side view (X-Z plane) of the semiconductor structure 100 taken along section line B-B of FIG. 2, FIG. 27 is a schematic cross-sectional side view (X-Z plane) of the semiconductor structure 100 taken along section line C-C of FIG. 2 and FIG. 28 is a schematic side view (Y-Z plane) of the semiconductor structure 100 taken along section line D-D of FIG. 2.

In some embodiments, etch mask 2000 may be removed, for example, using a plasma etch process or ash process and ILD 2600 may be formed, for example, by depositing a dielectric material, including, but not limited to SiN, $SiO_x$, low temperature oxide (LTO), high temperature oxide (HTO), flowable oxide (FOX) or some other dielectric, to form ILD 2600 in the gate structures 604 and between the pillars 1800-1, 1800-2 and 1800-3 of the BPR 1800. The ILD 2600 can be deposited using deposition techniques including, but not limited to, CVD, PECVD, RFCVD, PVD, ALD, MLD, MBD, PLD, and/or LSMCD, sputtering, and/or plating. Planarization, for example, chemical mechanical polishing (CMP) can be performed to remove excess material from ILD 2600 and planarize the resulting structure.

Figure 29A:
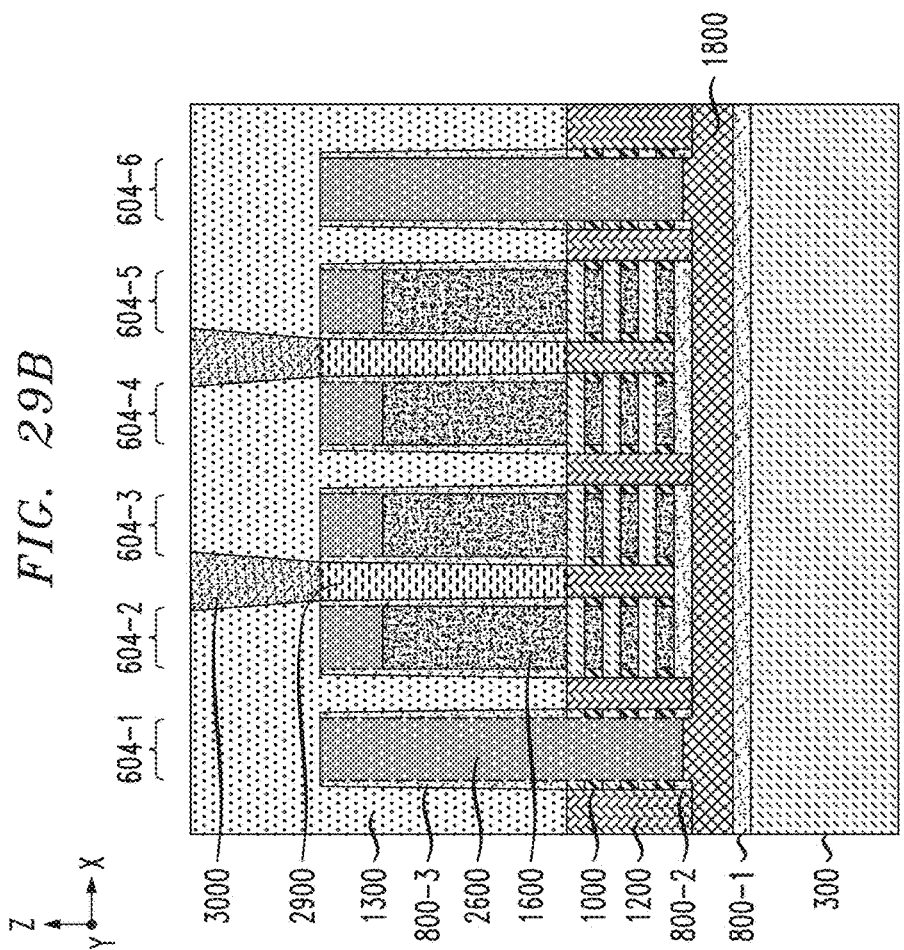
FIGS. 29A, 29B, 30 and 31 are cross-sectional views of the semiconductor structure of FIGS. 26A, 26B, 27 and 28 at an intermediate stage of fabrication after the formation of gate contacts to the source/drain regions that are electrically isolated from the BPR of their corresponding semiconductor devices and the formation of top contacts, according to an embodiment of the invention.
Figure 29B:
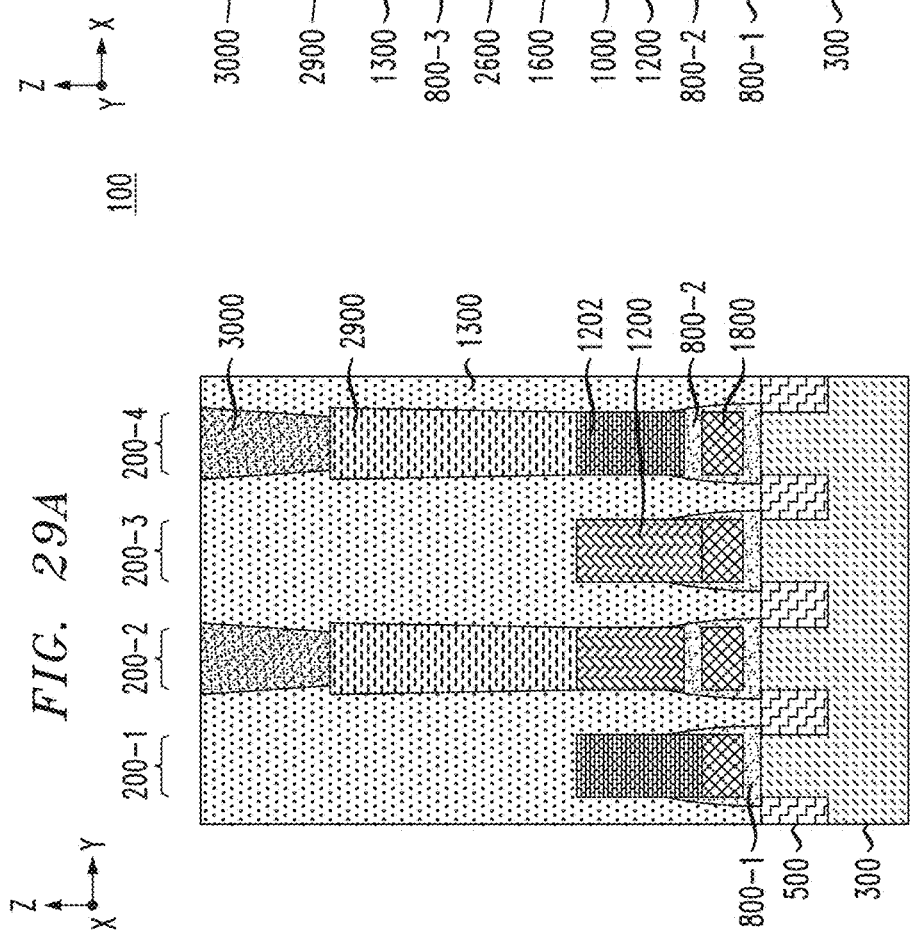
Figure 30:
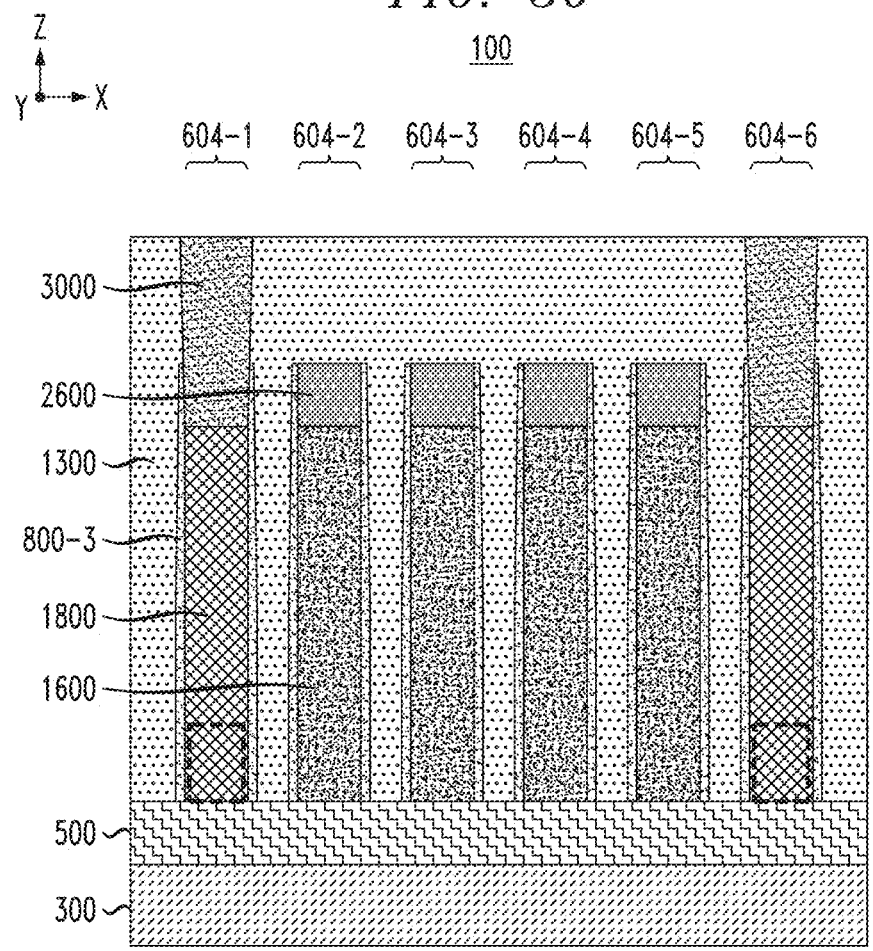
Figure 31:
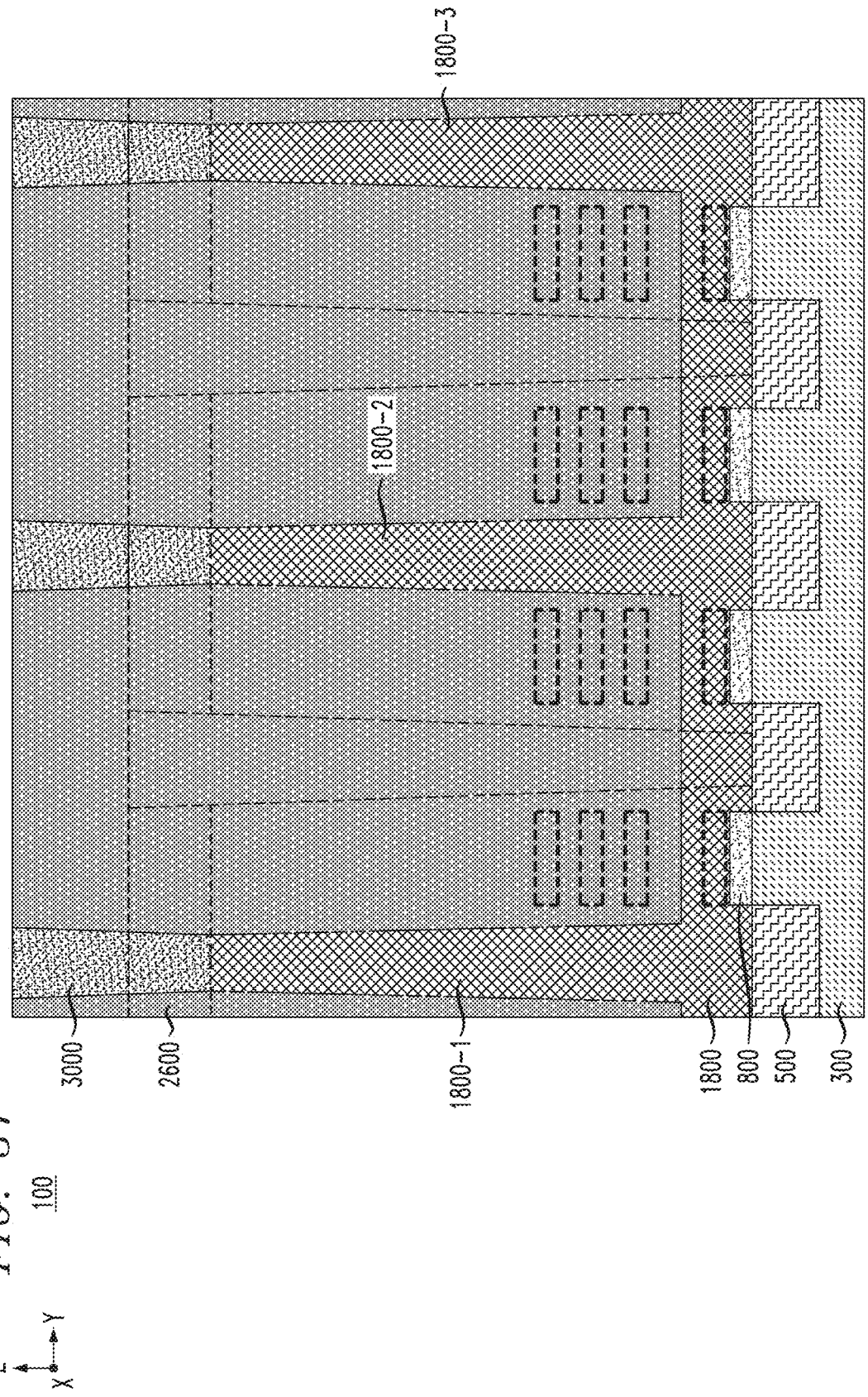

FIGS. 29A, 29B, 30 and 31 are cross-sectional views of the semiconductor structure 100 at an intermediate stage of fabrication after the formation of gate contacts 2900 to the source/drain regions 1200 and 1202 that are electrically isolated from the BPR 1800 of their corresponding semiconductor devices 200, the formation of additional ILD 1300 and 2600 and the trenching and formation of top contacts 3000. FIG. 29A is a schematic side view (Y-Z plane) of the semiconductor structure 100 taken along section line A-A of FIG. 2, FIG. 29B is a schematic cross-sectional side view (X-Z plane) of the semiconductor structure 100 taken along section line B-B of FIG. 2, FIG. 30 is a schematic cross-sectional side view (X-Z plane) of the semiconductor structure 100 taken along section line C-C of FIG. 2 and FIG. 31 is a schematic side view (Y-Z plane) of the semiconductor structure 100 taken along section line D-D of FIG. 2.

For example, an etch mask is formed by coating a layer of OPL material over the semiconductor structure 100 followed by a lithographic process to pattern the OPL such that the etch mask exposes the ILD 1300 disposed over those source/drain regions 1200 and 1202 that are isolated from the BPR 1800. The OPL may comprise, for example, a resin material that is applied by spin coating and baked to enhance planarization. The patterned portion of the OPL is removed and the pattern is etched down into the ILD 1300 to open and expose the source/drain regions 1200 and 1202 that are electrically isolated from the BPR 1800, as seen, for example, in FIGS. 29A and 29B. In illustrative embodiments, the etch process, e.g., a directional RIE process, is selective to the materials of the source/drain regions 1200 and 1202, dielectric layer 800 and BPR 1800. In some embodiments, multiple etch processes may be utilized that are selective to one or more of these materials. The etch mask may be removed, for example, using a plasma etch process or ash process.

Gate contacts 2900 are formed in contact with the exposed source/drain regions 1200 and 1202 by depositing a contact material, such as, for example, electrically conductive material including, but not necessarily limited to, tungsten, cobalt, zirconium, tantalum, titanium, aluminum, ruthenium, and/or copper. In some embodiments, a liner layer (not shown) including, for example, titanium and/or titanium nitride, may be formed on the exposed source/drain regions 1200 and 1202 before depositing the contact material. Deposition of the contact material can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

Following the formation of the gate contacts 2900, ILD material is again deposited to form the remainder of the ILDs 1300 and 2600 over the semiconductor structure 100. The ILD material is deposited using, for example, deposition techniques including, but not limited to, CVD, PECVD, RFCVD, PVD, ALD, MLD, MBD, PLD, LSMCD, sputtering, and/or plating, followed by a planarization process, such as, for example, CMP.

Contact trenches or vias are respectively opened in the ILD 1300 and ILD 2600 over the gate contacts 2900 and the pillars 1800-1, 1800-2 and 1800-3 using, for example, lithography followed by an RIE process to etch the contact trenches down to the gate contacts 2900 and the pillars 1800-1, 1800-2 and 1800-3 to expose the top surfaces of the gate contacts 2900 and pillars 1800-1, 1800-2 and 1800-3. Top contacts 3000 of the contact layer are formed on the exposed surfaces of the gate contacts 2900 and pillars 1800-1, 1800-2 and 1800-3 in the contact trenches, for example, as seen in FIGS. 29A, 29B, 30 and 31, by depositing a contact material, such as, for example, electrically conductive material including, but not necessarily limited to, tungsten, cobalt, zirconium, tantalum, titanium, aluminum, ruthenium, and/or copper. Deposition of the contact material can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

As can be seen in FIGS. 29A and 29B, in one example embodiment and layout, the source/drain regions 1200 and 1202 alternate between a contact with the BPR 1800 and a gate contact 2900 in both the x-direction and the y-direction. This allows the density of these regions and the gate structures 604 themselves to be increased since there is a reduced chance of having shorts between the contact materials. In addition, as seen in FIGS. 30 and 31, the BPR 1800 for each semiconductor device 200 is supplied via the respective pillars 1800-1, 1800-2 and 1800-3 and corresponding top contacts 3000 that are disposed in the SDBs which allows power to be fed to the BPR 1800 of each semiconductor device 200 from above in a region where no active gates are located instead of from a side of the semiconductor structure 100. In addition, because the BPR 1800 is cut by ILD 2600 between the pillars 1800-1, 1800-2 and 1800-3, different voltages may be fed to pillar 1800-1, pillar 1800-2 and pillar 1800-3. For example, in some embodiments, pillars 1800-1 and 1800-3 may be in electrical communication, e.g., via their corresponding top contacts 3000, and supply power of the same voltage to the same type of semiconductor devices 200, e.g., pFET or nFET, while pillar 1800-2 may supply power of a different voltage to a different type of semiconductor device 200. In an example where semiconductor devices 200-1 and 200-4 are pFET type devices while semiconductor devices 200-2 and 200-3 are nFET type devices. In such an example, pillars 1800-1 and 1800-3 supply power at a first voltage to the BPRs 1800 of pFET semiconductor devices 200-1 and 200-4 while pillar 1800-2 supplies power at a second voltage to the BPRs 1800 of nFET semiconductor devices 200-2 and 200-4.

Thereafter, any known sequence of processing steps can be performed to complete the fabrication of the semiconductor structure, the details of which are not needed to understand the illustrative embodiments. Briefly, by way of example, middle-of-the-line (MOL) processing can continue to form MOL contacts (e.g., gate contacts, source/drain contacts, etc.). Then, a back-end-of-line (BEOL) process module can be performed to fabricate a BEOL interconnect structure which provides connections to/between the MOL contacts, and other active or passive devices that are formed as part of the front-end-of-line (FEOL) layer.

Figure 32:
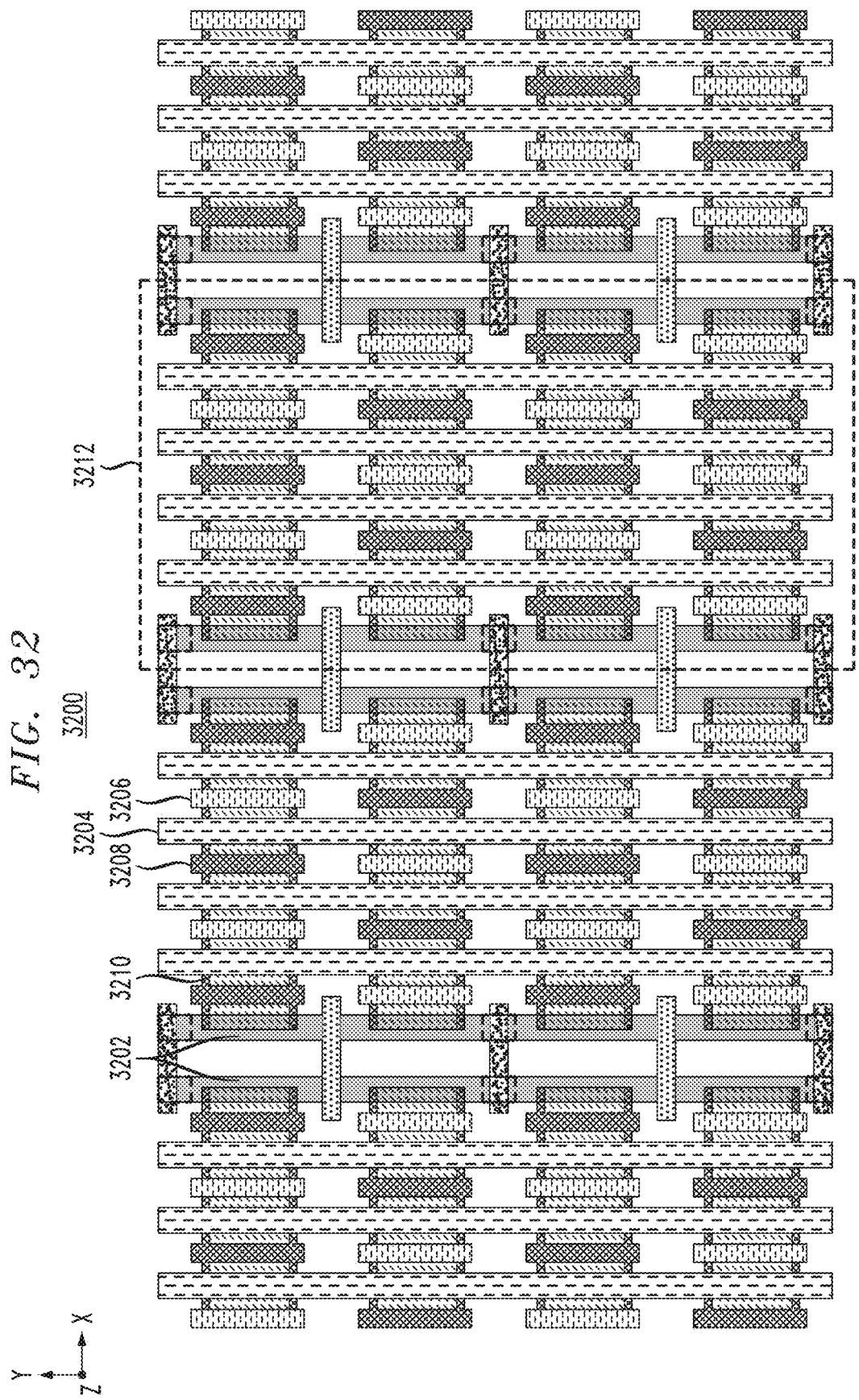
FIG. 32 is a schematic top-down view of a semiconductor structure, according to another embodiment of the invention.

FIG. 32 is a schematic top-down view (X-Y plane) of a semiconductor integrated circuit structure 3200 according to a second embodiment, also referred to herein as semiconductor structure 3200. For the sake of clarity, some elements of the semiconductor structure 3200 are not shown in FIG. 32. Semiconductor structure 3200 comprises double diffusion breaks (DDBs) 3202 each comprising a pair of inactive gates separating groups of active gates 3204 as compared to the SDBs 104 of the first embodiment of FIG. 1 that each comprise a single inactive gate. As will be described and illustrated in more detail below with reference to FIGS. 33-36, source/drain regions associated with the active gates 3204 are supplied with power via either top-down contacts 3206 or bottom-up contacts 3208, in a similar manner to semiconductor integrated circuit structure 100. The bottom-up contacts 3208 are electrically connected to buried power rails (BPRs) 3210 disposed beneath the source/drain regions. For example, in some embodiments, a source/drain region on one side of an active gate 3204 is connected to a top-down contact 3206 while a source/drain region on the other side of the active gate 3204 is connected to the BPR 3210 via a bottom-up contact 3208. While described with reference to top-down contacts and bottom-up contacts, semiconductor structure 3200 may be formed with contacts in any direction. The use of both top-down contacts 3206 and bottom-up contacts 3208 provides reduced tip to tip spacing which reduces the occurrence of shorts and allows for improved source/drain density. As seen in FIG. 32, the BPRs 3210 do not extend across the DDBs 3202 in the x-direction, in contrast to the BPRs 110 which extend across the SDBs 104 of the first embodiment of FIG. 1.

Figure 33:
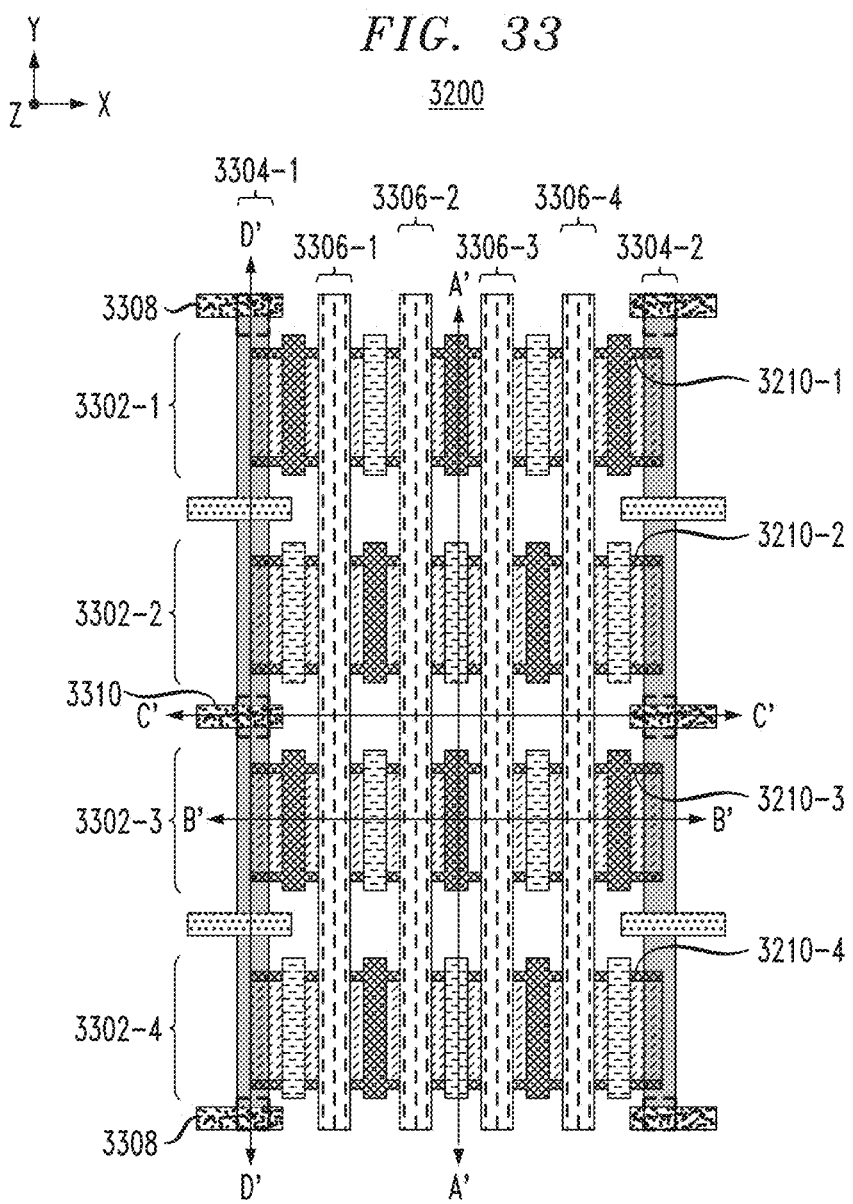
FIG. 33 is a schematic top-down view of a portion of the semiconductor structure of FIG. 32, according to an embodiment of the invention.

FIG. 33 is a schematic top-down view (X-Y plane) of a section 3212 of the semiconductor structure 3200 and will be utilized to further illustrate the features of semiconductor structure 3200. As seen in FIG. 33, semiconductor structure 3200 comprises semiconductor regions 3302-1, 3302-2, 3302-3 and 3302-4, collectively and individually referred to as semiconductor regions 3302, across which DDBs 3304-1 and 3304-2, collectively and individually referred to as DDBs 3304, and active gates 3306-1, 3306-2, 3306-3 and 3306-4, collectively and individually referred to as active gates 3306, are formed. Each semiconductor region 3302-1, 3302-2, 3302-3 and 3302-4 comprises a corresponding BPR 3210-1, 3210-2, 3210-3 and 3210-4, collectively and individually referred to as BPRs 3210, extending between each DDB 3304 but not across each DDB 3304. For example, a portion of a given BPR 3210 extends to a first inactive gate of the corresponding DDB 3304 but does not extend between the inactive gates of the DDB 3304.

While illustrated as having four semiconductor regions 3302 with four active gates 3306 between two DDBs 3304, any number of semiconductor regions 3302, DDBs 3304 and active gates 3306 may be included with any number of active gates 3306 disposed between each pair of DDBs 3304. In some embodiments, for example, semiconductor regions 3302 may be formed as nFET or pFET devices. In some embodiments, semiconductor regions 3302-1 and 3302-4 may comprise pFET devices while semiconductor regions 3302-2 and 3302-3 may comprise nFET devices. In other embodiments, the semiconductor regions 3302 may alternate between nFET and pFET devices where, e.g., semiconductor regions 3302-1 and 3302-3 comprise pFET devices while semiconductor regions 3302-2 and 3302-4 comprise nFET devices or vice versa.

The BPR 3210 between the DDBs 3304 for each semiconductor region 3302 is supplied with power via one or more corresponding top-down contacts 3308 or 3310 in the DDBs 3304. For example, top-down contacts 3308 may be set to a first voltage while top-down contacts 3310 may be set to a second voltage that is different than the first voltage. Top-down contacts 3308 supply power to the BPRs 3210 of the semiconductor regions 3302-1 and 3302-4 while top-down contacts 3310 supply power to the BPRs 3210 of the semiconductor regions 3302-2 and 3302-3. The use of top-down contacts 3308 and 3310 in the DDBs 3304 for supplying power to the BPRs 3210 allows for reduced n2n and p2p spacing since there is no need for the BPR to be formed within a shallow trench isolation (STI) layer. In some embodiments, the same contact 3308 or 3310 may be used to supply power to the BPRs 3210 on both sides of the DDBs 3304. FIG. 33 also defines cross-sections A'-A', B'-B', C'-C' and D'-D' that are similar to cross-sections A-A, B-B, C-C and D-D except that cross-section D'-D' corresponds to the portion of the DDB 3304-1 where the BPRs 3210 are not present. Cross sections A'-A', B'-B', C'-C' and D'-D' will be utilized for FIGS. 34A-36.

FIGS. 34A, 34B, 35 and 36 are cross-sectional views of the semiconductor structure 3200 of FIG. 32 at an intermediate stage of fabrication at a point similar to FIGS. 29A, 29B, 30 and 31 of semiconductor structure 100 of FIG. 1. FIG. 34A is a schematic side view (Y-Z plane) of the semiconductor structure 3200 taken along section line A'-A' of FIG. 32, FIG. 34B is a schematic cross-sectional side view (X-Z plane) of the semiconductor structure 3200 taken along section line B'-B' of FIG. 2, FIG. 35 is a schematic cross-sectional side view (X-Z plane) of the semiconductor structure 3200 taken along section line C'-C' of FIG. 32 and FIG. 32 is a schematic side view (Y-Z plane) of the semiconductor structure 3200 taken along section line D'-D' of FIG. 32.

In illustrative embodiments, the semiconductor structure 3200 as shown in FIGS. 34A, 34B, 35 and 36 is formed using similar processes and steps to semiconductor structure 100 as shown in FIGS. 29A, 29B, 30 and 31 where, for example similar numbers denote similar features. For example, semiconductor structure 3200 comprises a semiconductor substrate 3300, STI layer 3500, gate structures 3604-1 through 3604-6, portions 3800-1, 3800-2 and 3800-3 of a dielectric layer 3800, inner spacers 4000, source/drain regions 4200 and 4202, ILD 4300, ILD, gate conductor layers 4600, BPR 4800, ILD 5600, gate contacts 5900 and top contacts 6000. For example, some or all of the steps and processes described in FIGS. 3-31 may be utilized to form semiconductor structure 3200 in a similar manner to the formation of semiconductor structure 100. The differences between these processes and structures will now be described in more detail.

Figure 36:
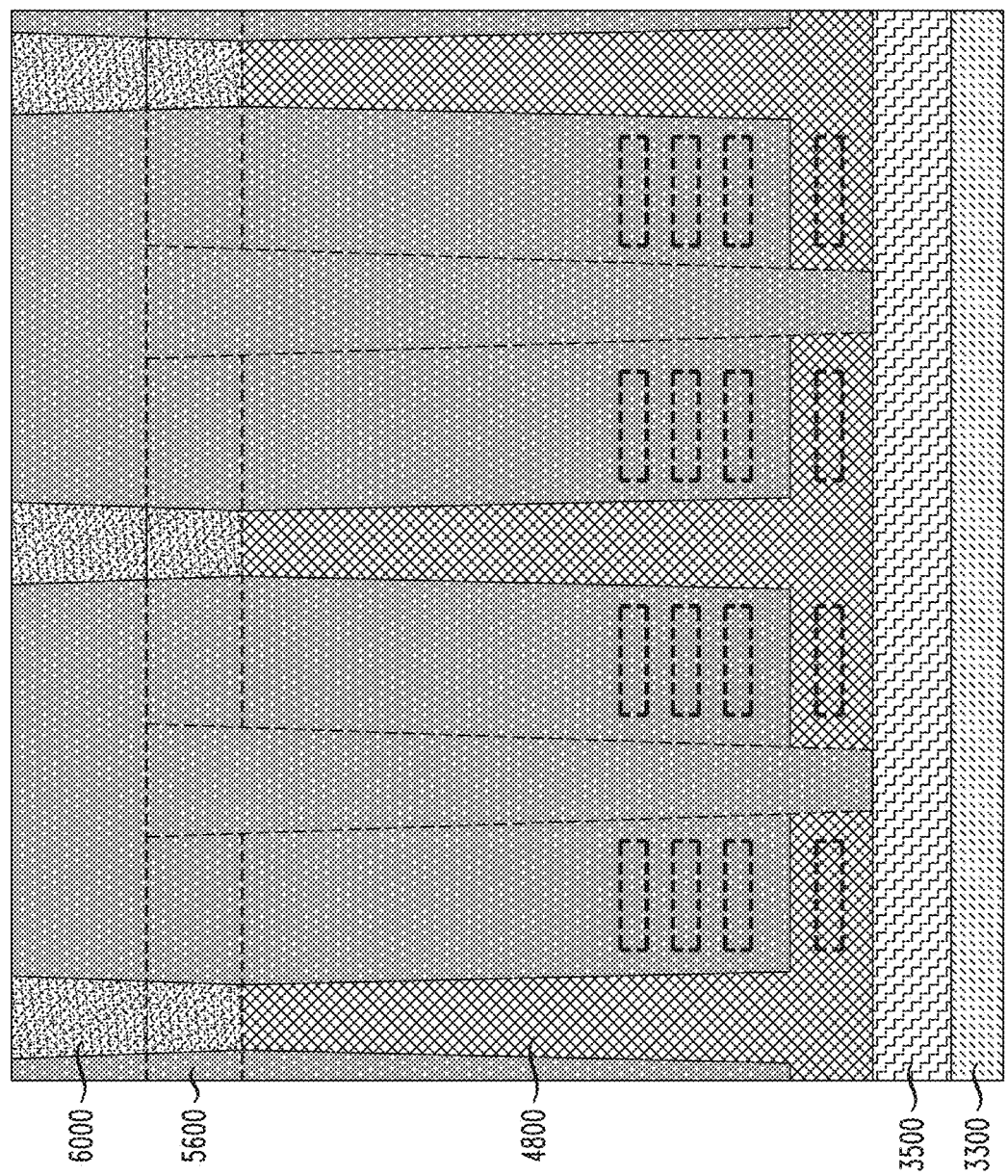

With reference to FIGS. 33, 34A and 34B, because the semiconductor regions 3302 are cut at the DDBs 3304, additional etching is performed and the STI layer 3500 is expanded to include the ends of the semiconductor regions 3302 beneath the DDBs 3304. For example, during the steps forming STI layer 3500, e.g., similar to those shown and described with reference to FIGS. 4A through 5A, the etching and formation of STI layer 3500 is also performed on the ends of the nanosheet stack structure and semiconductor substrate 3300 such that STI layer 3500 is formed in a position that will be at least partially under and adjacent the DDB gate structures 3604-1 and 3604-6, for example, as shown in FIG. 34B. In addition, as shown in FIG. 36, the STI layer 3500 extends across the entire DDB along the cross-section D'-D' as compared to the first embodiment where the STI layer 500 is only formed under the pillars 1800-1, 1800-2 and 1800-3 and the cuts between the BPRs 1800 as shown, for example, in FIG. 31.

As also seen in FIG. 34B, the gate structures 3604-1 and 3604-6 for the DDBs extend down the sides of the BPR 4800 such that the BPR 4800 is capped off on either end by portion 3800-3 of the dielectric layer 3800 of the gate structures 3604-1 and 3604-6 and by the STI layer 3500 with a portion of ILD 4300 also isolating the BPR 4800 from the DDBs, e.g., in the x-direction. In some embodiments, for example, instead of forming of the dummy gate electrodes and dielectric layer 3800 for gate structures 3604-1 and 3604-6 in the manner shown in FIG. 8B, a portion of the dummy gate electrodes and dielectric layers 3800 for the gate structures 3604-1 and 3604-6 may be formed down to the STI layer 3500 adjacent to the nanosheet stack structure. When the dummy gate electrodes and bottom most sacrificial layer are removed to form the BPR 4800, e.g., using the processes described above with reference to FIGS. 17A though 18B, the portion 3800-3 of the dielectric layer 3800 remains as shown, for example, in FIG. 34B. When the material for the BPR 4800 is deposited against the exposed portions 3800-1, 3800-2 and 3800-3 of the dielectric layer 3800, it is also deposited against an exposed portion of the STI layer 3500 that was in contact with the portion of the dummy gate electrode. In this manner, a semiconductor structure 3200 which supplies power to the BPRs via contacts disposed in the DDBs may be fabricated. This semiconductor structure 3200 provides the benefits of DDBs while providing the capability to have increased density.

The disclosed semiconductor structures 100 and 3200 allow for improved cell height scaling and routing density with the BPRs being unconstrained by the pitch of the gates for each semiconductor device, e.g., since the BPRs extend between the single or double diffusion breaks under and across the gate structures. By forming the BPRs under the gate structures, the BPRs also provide back-side shielding for the semiconductor devices, limiting the potential effect of back-side electromagnetic insertion attacks on the gate structures.

It is to be understood that the methods discussed herein for fabricating a semiconductor structure can be readily incorporated within semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

The invention claimed is:
1. A semiconductor structure, comprising:
a gate;
a first source/drain region;
a second source/drain region; and
a power rail disposed under the gate, first source/drain region and second source/drain region, the power rail extending to a diffusion break, and the power rail being in electrical contact with the first source/drain region and the diffusion break.

2. The semiconductor structure of claim 1, wherein the first source/drain region is disposed on a first side of the gate and the second source/drain region is disposed on a second side of the gate.

3. The semiconductor structure of claim 1, wherein the second source/drain region is isolated from the power rail by a dielectric layer.

4. The semiconductor structure of claim 1, wherein the gate is isolated from the power rail by a dielectric layer.

5. The semiconductor structure of claim 1, further comprising a contact, the second source/drain region being disposed between the contact and the power rail.

6. The semiconductor structure of claim 2, wherein the contact is electrically isolated from the power rail by a dielectric layer.

7. A semiconductor structure, comprising:
a first active gate;
a diffusion break, the diffusion break comprising an isolation region that is configured to electrically isolate the first active gate from at least a second active gate; and
a power rail disposed under the first active gate and extending to the diffusion break, the diffusion break comprising a contact electrically coupled to the power rail.

8. The semiconductor structure of claim 7, wherein:
the isolation region of the diffusion break comprises an inactive gate structure, the second active gate being disposed on an opposite side of the inactive gate structure from the first active gate; and
the power rail extends through the diffusion break and under the second gate.

9. The semiconductor structure of claim 7, wherein:
the isolation region of the diffusion break comprises first and second isolation regions, the second active gate being disposed on an opposite side of the first and second isolation regions from the first active gate;
the power rail extends to the first isolation region; and
a second power rail extends from the second isolation region under the second gate.

10. The semiconductor structure of claim 9, wherein:
the contact extends between the first isolation region and the second isolation region of the diffusion break;
the power rail is electrically coupled to the contact in the first isolation region; and
the second power rail is electrically coupled to the contact in the second isolation region.

11. The semiconductor structure of claim 9, wherein first and second isolation regions each comprise an inactive gate filled with a dielectric material.

12. The semiconductor structure of claim 7, wherein the contact comprises a first contact of the diffusion break, the diffusion break comprising at least a second contact electrically isolated from the first contact by a dielectric layer, the second contact being electrically coupled to a second power rail that extends from the diffusion break and under a third gate.

13. A semiconductor structure, comprising:
a semiconductor substrate;
a first dielectric layer disposed on the semiconductor substrate;
a power rail disposed on the first dielectric layer;
a second dielectric layer disposed on the power rail; and
a gate extending from the second dielectric layer.

14. The semiconductor structure of claim 13, wherein at least a portion of the power rail is disposed on a shallow trench isolation layer.

15. The semiconductor structure of claim 13, wherein the second dielectric layer comprises at least one gap, the power rail being in electrical communication with at least one source/drain region via the at least one gap.

16. The semiconductor structure of claim 15, the power rail is electrically isolated from at least another source/drain region by the second dielectric layer.

17. The semiconductor structure of claim 15, wherein power rail is electrically isolated from the gate by the second dielectric layer.

18. A semiconductor structure, comprising:
a plurality of semiconductor devices, each of the semiconductor devices being isolated from an adjacent semiconductor device by a dielectric layer;
a first diffusion break extending across the plurality of semiconductor devices;
a second diffusion break extending across the plurality of semiconductor devices; and
a plurality of active gates extending across the plurality of semiconductor devices, the plurality of active gates being disposed between the first diffusion break and the second diffusion break, each semiconductor device comprising a power rail extending between the first diffusion break and the second diffusion break under the plurality of active gates.

19. The semiconductor structure of claim 18, wherein the first diffusion break comprises a first contact and a second contact, the first contact being isolated from the second contact by the dielectric layer, the first contact being electrically coupled to the power rail of a first semiconductor device of the plurality of semiconductor devices and the second contact being electrically coupled to the power rail of a second semiconductor device of the plurality of semiconductor devices.

20. The semiconductor structure of claim 19, wherein the second diffusion break comprises a third contact and a fourth contact, the third contact being isolated from the fourth contact by the dielectric layer, the third contact being electrically coupled to the power rail of the first semiconductor device and the fourth contact being electrically coupled to the power rail of the second semiconductor device.

21. The semiconductor structure of claim 18, wherein:
each semiconductor device comprises a plurality of source/drain regions interposed between the gates;
a first source/drain region of a first semiconductor device of the plurality of semiconductor devices is disposed in electrical contact with the power rail of the first semiconductor device; and
a second source/drain region of the first semiconductor device is electrically isolated from the power rail of the first semiconductor device.

22. The semiconductor structure of claim 21, wherein the first source/drain region is disposed on a first side of a given gate of the plurality of gates and the second source/drain region is disposed on a second side of the given gate.

23. A method of fabricating a semiconductor structure, comprising:
forming a stack structure on a semiconductor substrate, the stack structure comprising a first sacrificial layer, a second sacrificial layer, a third sacrificial layer disposed between the first and second sacrificial layers, a plurality of additional sacrificial layers, and a plurality of channel layers;
forming a plurality of gate structures on the stack structure;

replacing the first and second sacrificial layers with a dielectric material to form corresponding first and second dielectric layers, the dielectric material also forming sidewalls on the gate structures;

etching the plurality of additional sacrificial layers, plurality of channel layers and second dielectric layer between first and second gate structures of the plurality of gate structures to expose the third sacrificial layer through the second dielectric layer;

forming a source/drain region between the first and second gate structures and in contact with the third sacrificial layer;

opening a given gate structure of the plurality of gate structures to expose the third sacrificial layer; and replacing the third sacrificial layer with a power rail, the power rail being in contact with the source/drain region.

24. The method of claim 23, wherein a thickness of the third sacrificial layer is greater than a thickness of the second sacrificial layer.

25. The method of claim 23, further comprising filling the given gate structure with a dielectric material to form an isolation region of a diffusion break, the diffusion break comprising a contact electrically coupled to the power rail to supply power to the power rail.

* * * * *